US012811106B2

United States Patent

(12) United States Patent
Mimura et al.

(10) Patent No.: US 12,811,106 B2
(45) Date of Patent: Nov. 24, 2026

(54) SURFACE MODIFYING METHOD AND SURFACE MODIFYING APPARATUS

(71) Applicant: Tokyo Electron Limited, Tokyo (JP)

(72) Inventors: Yuji Mimura, Koshi (JP); Hiroshi Maeda, Koshi (JP); Takuro Masuzumi, Koshi (JP); Takashi Terada, Koshi (JP); Masaru Honda, Koshi (JP); Ryoichi Sakamoto, Koshi (JP); Takashi Fuse, Nirasaki (JP); Yusuke Kubota, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 571 days.

(21) Appl. No.: 18/262,422

(22) PCT Filed: Jan. 13, 2022

(86) PCT No.: PCT/JP2022/000810
§ 371 (c)(1),
(2) Date: Jul. 21, 2023

(87) PCT Pub. No.: WO2022/158361
PCT Pub. Date: Jul. 28, 2022

(65) Prior Publication Data

US 2024/0079214 A1 Mar. 7, 2024

(30) Foreign Application Priority Data

Jan. 25, 2021 (JP) ................................ 2021-009813

(51) Int. Cl.
*H01J 37/32* (2006.01)

(52) U.S. Cl.
CPC .. *H01J 37/32449* (2013.01); *H01J 37/32743* (2013.01); *H01J 37/32981* (2013.01); *H01J 2237/336* (2013.01)

(58) Field of Classification Search
CPC ........... H01J 37/32449; H01J 37/32743; H01J 37/32981; H01J 2237/336; H10P 95/00; H10P 10/128
(Continued)

(56) References Cited

U.S. PATENT DOCUMENTS

2005/0173057 A1* 8/2005 Suga .................... H01J 37/321 156/379.6
2011/0053381 A1 3/2011 Kobayashi et al.
(Continued)

FOREIGN PATENT DOCUMENTS

JP H06-302486 A 10/1994
JP H07-226350 A 8/1995
(Continued)

OTHER PUBLICATIONS

International Search Report for PCT/JP2022/000810 dated Mar. 15, 2022.

*Primary Examiner* — James D Sells
(74) *Attorney, Agent, or Firm* — Chrisman Gallo Tochtrop LLC

(57) ABSTRACT

A surface modifying method of modifying a bonding surface of a substrate to be bonded to another substrate by plasma of a processing gas includes an adjusting process and a modifying process. In the adjusting process, an amount of moisture in a processing vessel is adjusted by supplying a humidified gas into the processing vessel allowed to accommodate the substrate therein. In the modifying process, the bonding surface of the substrate is modified by forming the plasma of the processing gas in the processing vessel in a state that the amount of moisture in the processing vessel is adjusted.

6 Claims, 12 Drawing Sheets

(58) Field of Classification Search
USPC .......................................................... 156/382
See application file for complete search history.

(56) References Cited

U.S. PATENT DOCUMENTS

| | | | | |
|---|---|---|---|---|
| 2019/0312007 | A1 | 10/2019 | Nagata et al. | |
| 2023/0136771 | A1 * | 5/2023 | Yamauchi ......... | H01J 37/32449 216/34 |

FOREIGN PATENT DOCUMENTS

| | | | |
|---|---|---|---|
| JP | H08-264520 | A | 10/1996 |
| JP | 2004-193401 | A | 7/2004 |
| JP | 2006-339363 | A | 12/2006 |
| JP | 2007-281166 | A | 10/2007 |
| JP | 2010-147052 | A | 7/2010 |
| JP | 2011-249643 | A | 12/2011 |
| JP | 2019-186288 | A | 10/2019 |
| TW | 201001543 | A1 | 1/2010 |
| TW | 201145381 | A | 12/2011 |
| TW | 201944866 | A | 11/2019 |
| WO | 2018/084285 | A1 | 5/2018 |

* cited by examiner

SURFACE MODIFYING METHOD AND SURFACE MODIFYING APPARATUS

CROSS-REFERENCE TO RELATED APPLICATIONS

This Application is a U.S. national phase application under 35 U.S.C. § 371 of PCT Application No. PCT/JP2022/000810 filed on Jan. 13, 2022, which claims the benefit of Japanese Patent Application No. 2021-009813 filed on Jan. 25, 2021, the entire disclosures of which are incorporated herein by reference.

TECHNICAL FIELD

The various aspects and embodiments described herein pertain generally to a surface modifying method and a surface modifying apparatus.

BACKGROUND

Conventionally, as a way to bond substrates such as semiconductor wafers, there is known a method in which bonding target surfaces of the substrates are modified, the modified surfaces of the substrates are hydrophilized, and the hydrophilized substrates are bonded by a Van der Waals force and a hydrogen bond (intermolecular force).

The surface modification of the substrate is performed by using a surface modifying apparatus. The surface modifying apparatus accommodates the substrate in a processing vessel and modifies the surface of the accommodated substrate with plasma of a processing gas.

Patent Document 1: International Publication No. 2018/084285

SUMMARY

In an exemplary embodiment, a surface modifying method of modifying a bonding surface of a substrate to be bonded to another substrate by plasma of a processing gas includes an adjusting process and a modifying process. In the adjusting process, an amount of moisture in a processing vessel is adjusted by supplying a humidified gas into the processing vessel allowed to accommodate the substrate therein. In the modifying process, the bonding surface of the substrate is modified by forming the plasma of the processing gas in the processing vessel in a state that the amount of moisture in the processing vessel is adjusted.

DETAILED DESCRIPTION

Hereinafter, exemplary embodiments of a surface modifying method and a surface modifying apparatus according to the present disclosure will be described in detail with reference to the accompanying drawings. The present disclosure is not limited to the exemplary embodiments to be described below. Further, it should be noted that the drawings are schematic and relations in sizes of individual components and ratios of the individual components may sometimes be different from actual values. Even between the drawings, there may exist parts having different dimensional relationships or different ratios.

When surface modification of substrates is repeatedly performed in a processing vessel of a surface modifying apparatus, the amount of moisture in the processing vessel gradually decreases due to vacuum-evacuation or the like. If the amount of moisture in the processing vessel decreases, the modification of the surfaces of the substrates may not be sufficiently performed because a state of plasma of a processing gas generated in the processing vessel changes. As a result, bonding strength between the substrates obtained when the modified substrate is bonded to another substrate may decrease. Such a decrease in the bonding strength is undesirable because it causes problems such as delamination of the substrate or the like. In this regard, there is a demand for a technique capable of suppressing the decrease in the bonding strength between the substrates to be bonded.

<Configuration of Bonding System>

Figure 1:
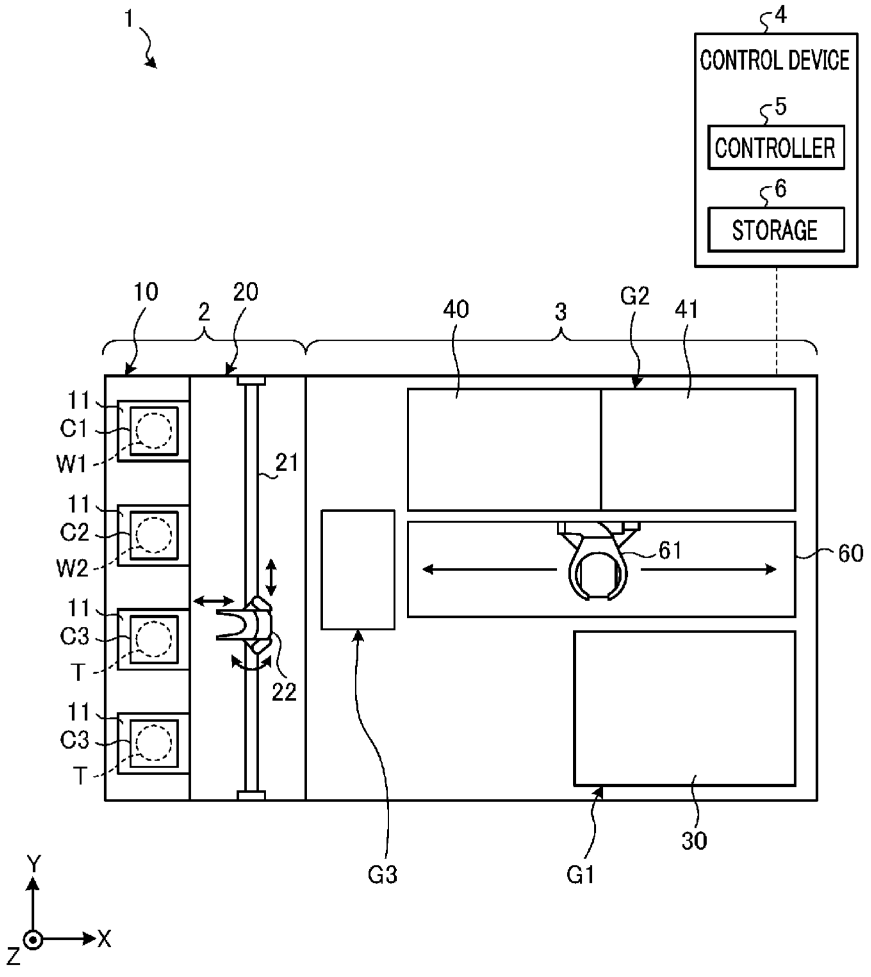
FIG. 1 is a schematic plan view illustrating a configuration of a bonding system according to an exemplary embodiment.
Figure 2:
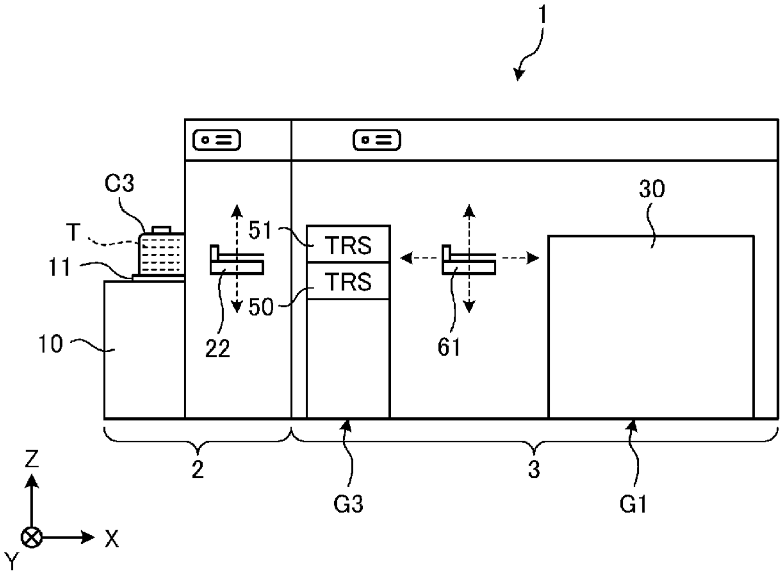
FIG. 2 is a schematic side view illustrating the configuration of the bonding system according to the exemplary embodiment.
Figure 3:
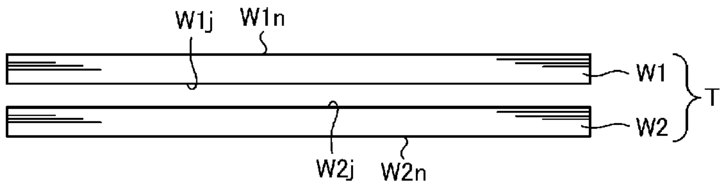
FIG. 3 is a schematic side view of an upper wafer and a lower wafer according to the exemplary embodiment.

First, a configuration of a bonding system 1 according to an exemplary embodiment will be explained with reference to FIG. 1 to FIG. 3. FIG. 1 is a schematic plan view illustrating the configuration of the bonding system 1 according to the exemplary embodiment, and FIG. 2 is a schematic side view of the same. Further, FIG. 3 is a schematic side view of an upper wafer W1 and a lower wafer W2 according to the exemplary embodiment. In the various drawings referred to below, for the sake of easy understanding of the description, an orthogonal coordinate system in which the positive Z-axis direction is defined as a vertically upward direction may sometimes be used.

The bonding system 1 shown in FIG. 1 is configured to form a combined wafer T by bonding a first substrate W1 and a second substrate W2.

The first substrate W1 is a substrate on which a plurality of electronic circuits is formed on a semiconductor substrate such as a silicon wafer or a compound semiconductor wafer. The second substrate W2 is, for example, a bare wafer having no electronic circuit formed thereon. The first substrate W1 and the second substrate W2 have approximately the same diameter. Further, an electronic circuit may be formed on the second substrate W2.

Hereinafter, the first substrate W1 will be referred to as "upper wafer W1", and the second substrate W2 will be referred to as "lower wafer W2". That is, the upper wafer W1 is an example of a first substrate, and the lower wafer W2 is an example of a second substrate. Also, the upper wafer W1 and the lower wafer W2 together may be referred to as "wafer W".

Further, in the following description, as shown in FIG. 3, among plate surfaces of the upper wafer W1, the plate surface to be bonded to the lower wafer W2 will be referred to as "bonding surface W1*j*", and the plate surface opposite to the bonding surface W1*j* will be referred to as "non-bonding surface W1*n*". Further, among plate surfaces of the lower wafer W2, the plate surface to be bonded to the upper wafer W1 will be referred to as "bonding surface W2*j*", and the plate surface opposite to the bonding surface W2*j* will be referred to as "non-bonding surface W2*n*".

As depicted in FIG. 1, the bonding system 1 is equipped with a carry-in/out station 2 and a processing station 3. The carry-in/out station 2 and the processing station 3 are arranged in the order of the carry-in/out station 2 and the processing station 3 along the positive X-axis direction. In addition, the carry-in/out station 2 and the processing station 3 are connected as one body.

The carry-in/out station 2 includes a placing table 10 and a transfer section 20. The placing table 10 is equipped with a plurality of placing plates 11. Cassettes C1, C2, and C3 each of which accommodates therein a plurality of (for example, 25 sheets of) substrates horizontally are respectively placed on the placing plates 11. For example, the cassette C1 accommodates therein the upper wafer W1; the cassette C2, the lower wafer W2; and the cassette C3, the combined wafer T.

The transfer section 20 is provided adjacent to the positive X-axis side of the placing table 10. Provided in this transfer section 20 are a transfer path 21 extending in the Y-axis direction and a transfer device 22 configured to be movable along this transfer path 21.

The transfer device 22 is configured to be movable in the X-axis direction as well as in the Y-axis direction and pivotable around the Z-axis. The transfer device 22 transfers the upper wafer W1, the lower wafer W2, and the combined wafer T between the cassettes C1 to C3 placed on the placing plates 11 and the processing station 3 to be described later.

Further, the number of the cassettes C1 to C3 disposed on the placing plates 11 is not limited to the shown example. In addition to the cassettes C1, C2, and C3, a cassette for collecting a defective substrate or the like may also be disposed on the placing plate 11.

The processing station 3 includes a plurality of processing blocks, for example, three processing blocks G1, G2 and G3, equipped with various types of apparatuses. By way of example, the first processing block G1 is provided on the front side (negative Y-axis side of FIG. 1) of the processing station 3, and the second processing block G2 is provided on the rear side (positive Y-axis side of FIG. 1) of the processing station 3. Further, the third processing block G3 is provided on the carry-in/out station 2 side (negative X-axis side in FIG. 1) of the processing station 3.

Disposed in the first processing block G1 is a surface modifying apparatus 30 configured to modify the bonding surface W1*j* of the upper wafer W1 and the bonding surface W2*j* of the lower wafer W2 with plasma of a processing gas. The surface modifying apparatus 30 forms a dangling bond in the bonding surface W1*j* of the upper wafer W1 and the bonding surface W2*j* of the lower wafer W2, thus allowing the bonding surfaces W1*j* and W2*j* to be modified so that they are easily hydrophilized afterwards.

Further, in the surface modifying apparatus 30, a preset processing gas is excited into plasma under, for example, a decompressed atmosphere to be ionized. As ions of an element contained in this processing gas are radiated to the bonding surfaces W1*j* and W2*j* of the upper wafer W1 and the lower wafer W2, the bonding surfaces W1*j* and W2*j* are modified by being plasma-processed. Details of this surface modifying apparatus 30 will be described later.

Disposed in the second processing block G2 is a surface hydrophilizing apparatus 40 and a bonding apparatus 41. The surface hydrophilizing apparatus 40 is configured to hydrophilize and clean the bonding surfaces W1*j* and W2*j* of the upper wafer W1 and the lower wafer W2 with, for example, pure water.

In the surface hydrophilizing apparatus 40, the pure water is supplied onto the upper wafer W1 or the lower wafer W2 while rotating the upper wafer W1 or the lower wafer W2 held by, for example, a spin chuck. Accordingly, the pure water supplied onto the upper wafer W1 or the lower wafer W2 is diffused on the bonding surface W1*j* of the upper wafer W1 or the bonding surface W2*j* of the lower wafer W2, so that the bonding surfaces W1*j* and W2*j* are hydrophilized.

The bonding apparatus 41 is configured to bond the upper wafer W1 and the lower wafer W2. Details of this bonding apparatus 41 will be described later.

In the third processing block G3, transition (TRS) devices 50 and 51 for the upper wafer W1, the lower wafer W2, and the combined wafer T are sequentially arranged in two levels from the bottom, as illustrated in FIG. 2.

Further, as shown in FIG. 1, a transfer section 60 is formed in an area surrounded by the first processing block G1, the second processing block G2, and the third processing block G3. In the transfer section 60, a transfer device 61 is disposed. The transfer device 61 has a transfer arm configured to be movable in a vertical direction and a horizontal direction and pivotable around a vertical axis, for example.

This transfer device 61 is moved within the transfer section 60 to transfer the upper wafer W1, the lower wafer W2, and the combined wafer T to preset apparatuses within the first processing block G1, the second processing block G2, and the third processing block G3 adjacent to the transfer section 60.

Furthermore, the bonding system 1 is equipped with a control device 4. The control device 4 controls an operation of the bonding system 1. The control device 4 is, for example, a computer, and includes a controller 5 and a storage 6. The storage 6 stores therein a program for controlling various kinds of processings such as a bonding processing. The controller 5 controls the operation of the bonding system 1 by reading and executing the program stored in the storage 6.

In addition, this program may be recorded on a computer-readable recording medium and installed from the recording medium to the storage 6 of the control device 4. The computer-readable recording medium may be, by way of non-limiting example, a hard disk (HD), a flexible disk (FD), a compact disk (CD), a magnet optical disk (MO), a memory card, or the like.

<Configuration of Surface Modifying Apparatus>

Figure 4:
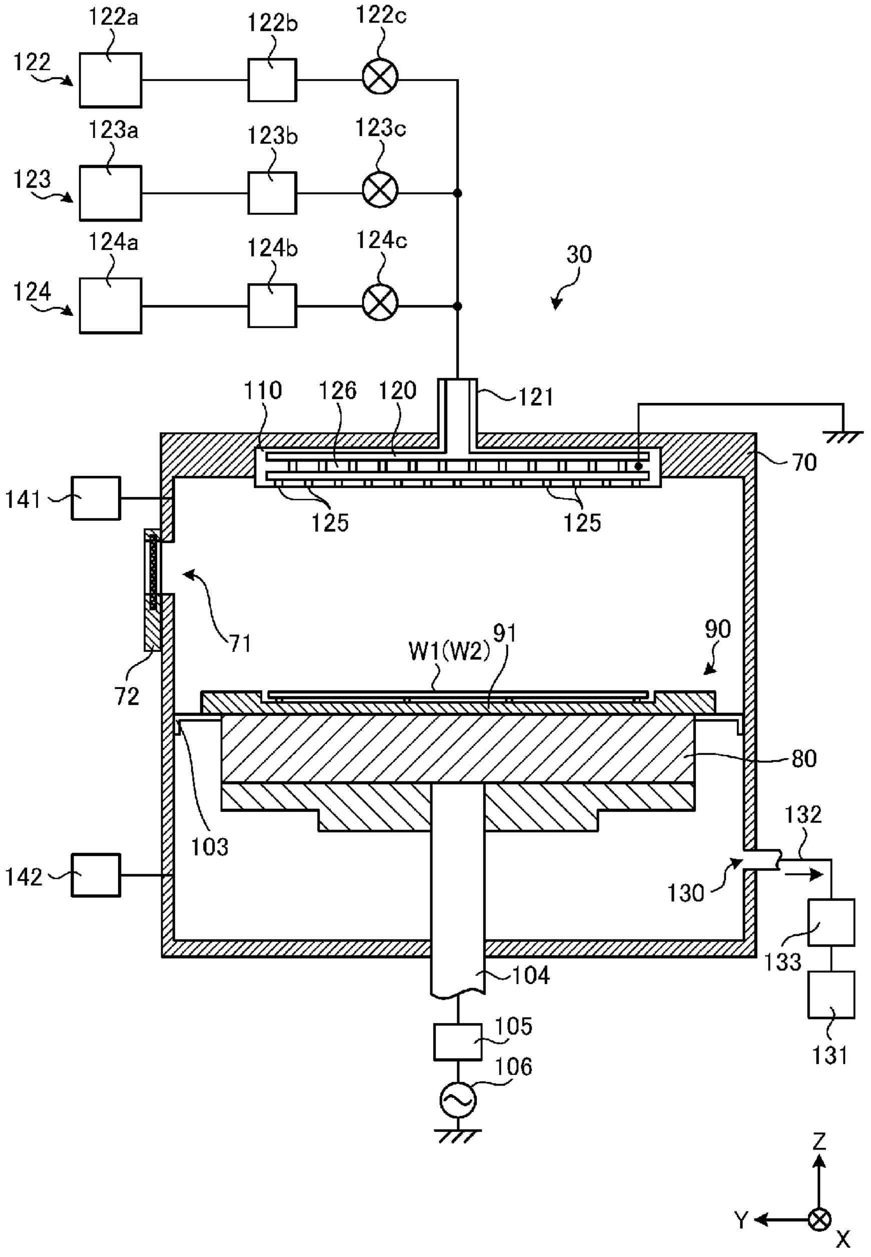
FIG. 4 is a schematic cross-sectional view illustrating a configuration of a surface modifying apparatus according to the exemplary embodiment.

Now, a configuration of the surface modifying apparatus 30 will be explained with reference to FIG. 4. FIG. 4 is a schematic cross-sectional view illustrating the configuration of the surface modifying apparatus 30 according to the exemplary embodiment.

As depicted in FIG. 4, the surface modifying apparatus 30 includes a processing vessel 70 having a hermetically sealable inside. A carry-in/out opening 71 for the upper wafer W1 or the lower wafer W2 is formed at a side surface of the processing vessel 70 on the transfer section 60 (see FIG. 1) side, and a gate valve 72 is provided at the carry-in/out opening 71.

A stage 80 is disposed inside the processing vessel 70. The stage 80 is, for example, a lower electrode, and is made of a conductive material such as, but not limited to, aluminum. The stage 80 is provided with non-illustrated through holes for pins, and non-illustrated lifter pins are accommodated in these through holes for pins. The lifter pins are configured to be movable up and down by an elevating mechanism not shown.

A top surface of the stage 80, that is, the surface facing an upper electrode 110 is a circular horizontal surface having a larger diameter than the upper wafer W1 and the lower wafer W2, when viewed from the top. A stage cover 90 is disposed on the top surface of the stage 80, and the upper wafer W1 or the lower wafer W2 is placed on a placing portion 91 of the stage cover 90.

A ring-shaped partition plate 103 provided with a multiple number of baffle holes is disposed between the stage 80 and an inner wall of the processing vessel 70. The partition plate 103 is also referred to as an exhaust ring. This partition plate 103 partitions the internal space of the processing vessel 70 into an upper space and a lower space with the placing portion 91 as a boundary. The partition plate 103 allows an atmosphere within the processing vessel 70 to be uniformly exhausted from the inside of the processing vessel 70.

A power feed rod 104 formed of a conductor is connected to a bottom surface of the stage 80. The power feed rod 104 is connected to a first high frequency power supply 106 via a matching device 105 which is composed of, for example, a blocking capacitor or the like. When a plasma processing is performed, a preset high frequency voltage is applied to the stage 80 from the first high frequency power supply 106.

The upper electrode 110 is disposed within the processing vessel 70. The top surface of the stage 80 and a bottom surface of the upper electrode 110 are disposed to face each other in parallel with a certain distance therebetween.

The upper electrode 110 is grounded to be connected to the ground potential. Since the upper electrode 110 is grounded in this way, damage to the bottom surface of the upper electrode 110 can be suppressed during the plasma processing.

In this way, as the high frequency voltage is applied from the first high frequency power supply 106 to the stage 80 serving as the lower electrode, plasma is formed within the processing vessel 70.

In the exemplary embodiment, the stage 80, the power feed rod 104, the matching device 105, the first high frequency power supply 106 and the upper electrode 110 constitute an example of a plasma forming mechanism configured to form the plasma of the processing gas within the processing vessel 70. Moreover, the first high frequency power supply 106 is controlled by the controller 5 of the control device 4 described above.

A hollow space 120 is formed inside the upper electrode 110. A gas supply line 121 is connected to this hollow space 120. The gas supply line 121 is connected to a processing gas supply mechanism 122, an inert gas supply mechanism 123, and a humidified gas supply mechanism 124.

The processing gas supply mechanism 122 is configured to supply the processing gas to the hollow space 120 of the upper electrode 110 via the gas supply line 121. By way of non-limiting example, an oxygen gas, a nitrogen gas, an argon gas, or the like is used as the processing gas. The processing gas supply mechanism 122 includes a processing gas source 122*a*, a flow rate controller 122*b*, and a valve 122*c*. The processing gas supplied from the processing gas source 122*a* is supplied into the hollow space 120 of the upper electrode 110 via the gas supply line 121 with its flow rate adjusted by the flow rate controller 122*b* and the valve 122*c*. The processing gas supply mechanism 122 is an example of a first gas supply.

The inert gas supply mechanism 123 is configured to supply an inert gas to the hollow space 120 of the upper electrode 110 via the gas supply pipe 121. By way of non-limiting example, a nitrogen gas or an argon gas is used as the inert gas. The inert gas supply mechanism 123 has an inert gas source 123*a*, a flow rate controller 123*b*, and a valve 123*c*. The inert gas supplied from the inert gas source 123*a* is supplied into the hollow space 120 of the upper electrode 110 via the gas supply line 121 with its flow rate adjusted by the flow rate controller 123*b* and the valve 123*c*.

The humidified gas supply mechanism 124 is configured to supply a gas, which is humidified, (humidified gas) to the hollow space 120 of the upper electrode 110 via the gas supply line 121. By way of non-limiting example, a humidified nitrogen gas or a humidified argon gas is used as the humidified gas. Alternatively, air having adjusted temperature and humidity may be used as the humidified gas. The humidified gas supply mechanism 124 has a humidified gas source 124*a*, a flow rate controller 124*b*, and a valve 124*c*. The humidified gas supplied from the humidified gas source 124*a* is supplied into the hollow space 120 of the upper electrode 110 via the gas supply line 121 with its flow rate adjusted by the flow rate controller 124*b* and the valve 124*c*. The humidified gas supply mechanism 124 is an example of a second gas supply.

A baffle plate 126 is provided in the hollow space 120 to accelerate uniform diffusion of the processing gas, the inert gas and the humidified gas. The baffle plate 126 is provided with a number of small holes. A multiple number of gas discharge openings 125 are formed in a bottom surface of the upper electrode 110 to discharge the processing gas, the inert gas and the humidified gas from the hollow space 120 into the processing vessel 70.

The processing vessel 70 is provided with an intake port 130. Connected to the intake port 130 is an intake line 132 that communicates with a vacuum pump 131 configured to decompress the atmosphere within the processing vessel 70 to a preset vacuum level. The intake line 132 is equipped with an APC (Auto Pressure Controller) valve 133. As the inside of the processing vessel 70 is evacuated by the vacuum pump 131, the opening degree of the APC valve 133 is adjusted, so that the pressure inside the processing vessel 70 is maintained at a predetermined pressure.

The processing vessel 70 is equipped with a spectrophotometer 141 capable of measuring light emission data of wavelengths within the processing vessel 70. Specifically, the spectrophotometer 141 is mounted to the processing vessel 70 so as to be located above the placing portion 91 and below the gas discharge openings 125. The spectrophotometer 141 is, for example, an OES (Optical Emission Spectroscopy) sensor, and it measures a light emission state of the plasma formed in the processing vessel 70. The spectrophotometer 141 may be a self-bias type OES sensor capable of forming plasma in its own chamber and measuring a light emission state of that plasma. The spectrophotometer 141 outputs the measured light emission data to the controller 5 of the control device 4.

In addition, the processing vessel 70 is further equipped with a mass spectrometer 142 capable of analyzing the atmosphere within the processing vessel 70 with respect to a mass number of a specific substance. Specifically, the mass spectrometer 142 is mounted to the processing vessel 70 so as to be located below the partition plate 103. The mass spectrometer 142 is, for example, a quadrupole mass spectrometer (QMS), and it measures an analysis value obtained by analyzing the atmosphere within the processing vessel 70 with respect to the mass number of the specific substance. The mass spectrometer 142 outputs the measured analysis value to the controller 5 of the control device 4. By disposing the mass spectrometer 142 below the partition plate 103, damage to the mass spectrometer 142 by the plasma can be suppressed.

<Configuration of Bonding Apparatus>

Figure 5:
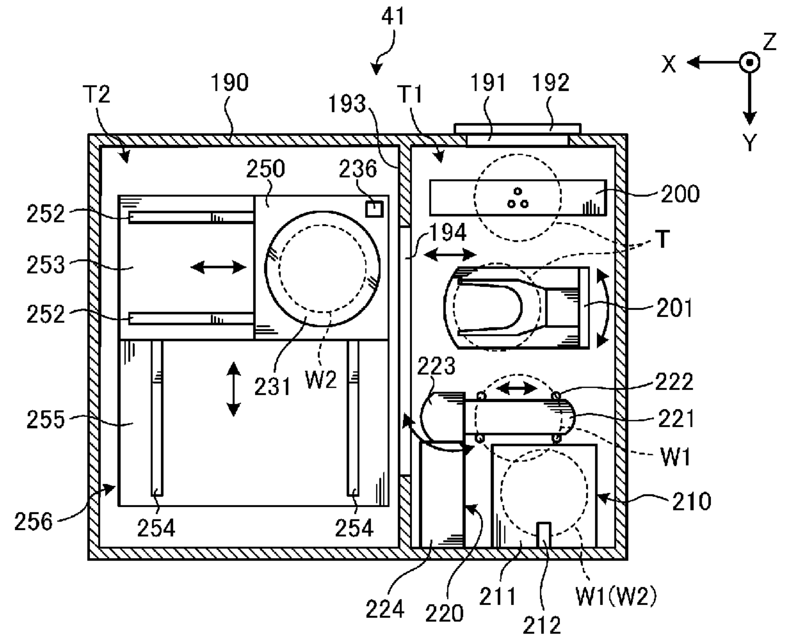
FIG. 5 is a schematic plan view illustrating a configuration of a bonding apparatus according to the exemplary embodiment.
Figure 6:
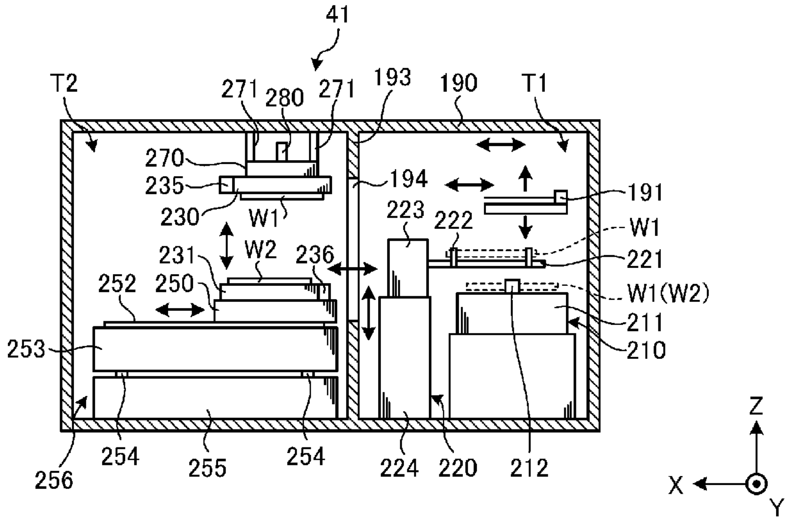
FIG. 6 is a schematic plan view illustrating the configuration of the bonding apparatus according to the exemplary embodiment.

Now, a configuration of the bonding apparatus 41 will be discussed with reference to FIG. 5 and FIG. 6. FIG. 5 is a schematic plan view illustrating the configuration of the bonding apparatus 41 according to the exemplary embodiment, and FIG. 6 is a schematic side view illustrating the configuration of the bonding apparatus 41 according to the exemplary embodiment.

As depicted in FIG. 5, the bonding apparatus 41 has a processing vessel 190 having a hermetically sealable inside. A carry-in/out opening 191 for the upper wafer W1, the lower wafer W2, and the combined wafer T is formed at a side surface of the processing vessel 190 on the transfer section 60 side, and an opening/closing shutter 192 is provided at the carry-in/out opening 191.

The inside of the processing vessel 190 is partitioned into a transfer section T1 and a processing section T2 by an inner wall 193. The aforementioned carry-in/out opening 191 is formed at the side surface of the processing vessel 190 in the transfer section T1. Further, the inner wall 193 is also provided with a carry-in/out opening 194 for the upper wafer W1, the lower wafer W2, and the combined wafer T.

In the transfer section T1, a transition device 200, a substrate transfer mechanism 201, an inverting mechanism 220, and a position adjusting mechanism 210 are arranged in this sequence from the carry-in/out opening 191 side, for example.

The transition device 200 temporarily places therein the upper wafer W1, the lower wafer W2, and the combined wafer T. The transition device 200 is formed in, for example, two levels and thus are capable of placing therein any two of the upper wafer W1, the lower wafer W2, and the combined wafer T at the same time.

The substrate transfer mechanism 201 has a transfer arm configured to be movable in a vertical direction (Z-axis direction) and horizontal directions (X-axis direction and Y-axis direction) and pivotable around a vertical axis (0 direction), for example. The substrate transfer mechanism 201 can transfer the upper wafer W1, the lower wafer W2, and the combined wafer T within the transfer section T1 or between the transfer section T1 and the processing section T2.

The position adjusting mechanism 210 is configured to adjust the directions of the upper wafer W1 and the lower wafer W2 in a horizontal direction. Specifically, the position adjusting mechanism 210 includes a base 211 provided with a holder (not shown) configured to hold and rotate the upper and lower wafers W1 and W2, and a detector 212 configured to detect the positions of notches of the upper wafer W1 and the lower wafer W2. By detecting the positions of the notches of the upper wafer W1 and the lower wafer W2 with the detector 212 while rotating the upper wafer W1 and the lower wafer W2 held by the base 211, the position adjusting mechanism 210 adjusts the positions of the notches. Accordingly, the directions of the upper wafer W1 and the lower wafer W2 in the horizontal direction are adjusted.

The inverting mechanism 220 is configured to invert the front and rear surfaces of the upper wafer W1. Specifically, the inverting mechanism 220 has a holding arm 221 configured to hold the upper wafer W1. The holding arm 221 extends in a horizontal direction (X-axis direction). Further, holding members 222 configured to hold the upper wafer W1 are provided at, for example, four positions on the holding arm 221.

The holding arm 221 is supported by a driving unit 223 equipped with, for example, a motor or the like. The holding arm 221 is rotatable around a horizontal axis by this driving unit 223. In addition, the holding arm 221 is also rotatable about the driving unit 223 and can move in a horizontal direction (X-axis direction). Below the driving unit 223, another driving unit (not shown) provided with, for example, a motor or the like is provided. The driving unit 223 can be moved in a vertical direction by this another driving unit along a supporting column 224 extending in the vertical direction.

In this way, the upper wafer W1 held by the holding members 222 can be rotated around the horizontal axis and can also be moved in the vertical and horizontal directions by the driving unit 223. Further, the upper wafer W1 held by the holding members 222 can be moved between the position adjusting mechanism 210 and an upper chuck 230 to be described later by being rotated about the driving unit 223.

In the processing section T2, there are provided the upper chuck 230 configured to attract and hold the top surface (non-bonding surface W1*n*) of the upper wafer W1 from above and a lower chuck 231 configured to attract and hold the bottom surface (non-bonding surface W2*n*) of the lower wafer W2 from below. The lower chuck 231 is disposed below the upper chuck 230, and faces the upper chuck 230. The upper chuck 230 and the lower chuck 231 are, for example, vacuum chucks.

As depicted in FIG. 6, the upper chuck 230 is supported by a supporting member 270 provided above the upper chuck 230. The supporting member 270 is fixed to a ceiling surface of the processing vessel 190 with, for example, a plurality of supporting columns 271 therebetween.

An upper imaging unit 235 configured to image the top surface (bonding surface W2*j*) of the lower wafer W2 held by the lower chuck 231 is disposed on a lateral side of the upper chuck 230. The upper imaging unit 235 is configured as, for example, a CCD camera.

The lower chuck 231 is supported by a first moving unit 250 disposed under the lower chuck 231. The first moving unit 250 moves the lower chuck 231 in a horizontal direction (X-axis direction) as will be described later. Further, the first moving unit 250 is configured to be able to move the lower chuck 231 in a vertical direction as well and to be able to be rotated around a vertical axis.

The first moving unit 250 is equipped with a lower imaging unit 236 configured to image the bottom surface (bonding surface W1*j*) of the first substrate W1 held by the upper chuck 230. The lower imaging unit 236 is configured as, for example, a CCD camera.

The first moving unit 250 is mounted to a pair of rails 252. The rails 252 are disposed on the bottom surface side of the first moving unit 250 and is elongated in a horizontal direction (X-axis direction). The first moving unit 250 is configured to be movable along these rails 252.

The pair of rails 252 are provided on a second moving unit 253. The second moving unit 253 is mounted to a pair of rails 254. The rails 254 are provided on the bottom surface side of the second driving unit 253, and is elongated in a horizontal direction (Y-axis direction). The second moving unit 253 is configured to be movable in the horizontal direction (Y-axis direction) along the rails 254. Further, the pair of rails 254 are disposed on a placing table 255 which is provided on a bottom surface of the processing vessel 190.

The first moving unit 250, the second moving unit 253, and the like constitute a position alignment unit 256. The position alignment unit 256 moves the lower chuck 231 in the X-axis direction, the Y-axis direction, and the θ direction, thus allowing the upper wafer W1 held by the upper chuck 230 and the lower wafer W2 held by the lower chuck 231 to be aligned with each other in a horizontal direction. In addition, the position alignment unit 256 moves the lower chuck 231 in the Z-axis direction as well, thus allowing the upper wafer W1 held by the upper chuck 230 and the lower wafer W2 held by the lower chuck 231 to be aligned with each other in a vertical direction.

Here, although the lower chuck 231 is moved in the X-axis direction, the Y-axis direction, and the θ direction, the position alignment unit 256 may move the lower chuck 231 in the X-axis direction and the Y-axis direction while moving the upper chuck 230 in the θ direction, for example. Further, although the lower chuck 231 is moved in the Z-axis direction here, the position alignment unit 256 may move the upper chuck 230 in the Z-axis direction, for example.

Figure 7:
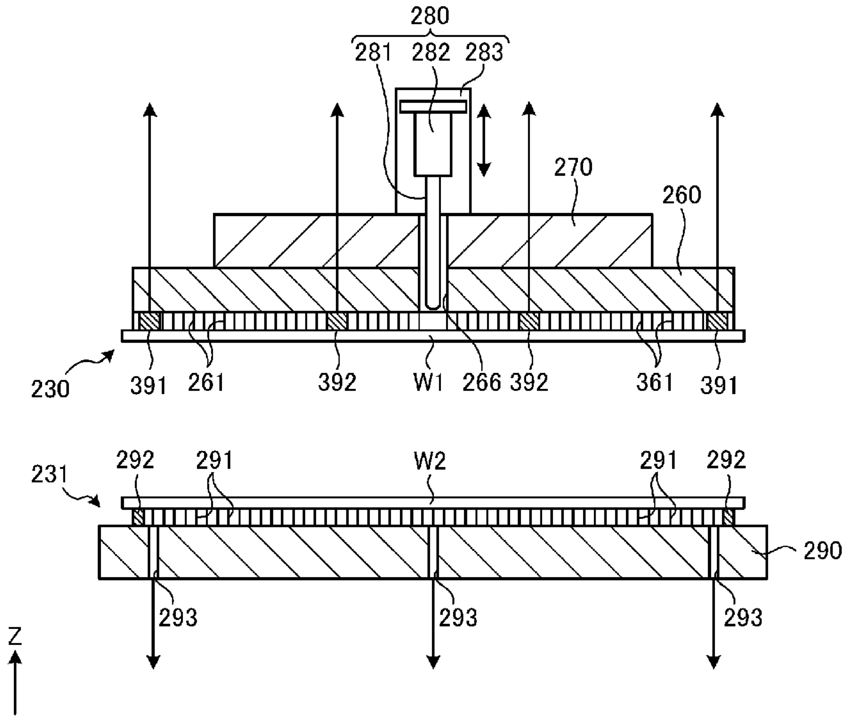
FIG. 7 is a cross sectional view illustrating an upper chuck and a lower chuck according to the exemplary embodiment.

Now, a configuration of the upper chuck 230 and the lower chuck 231 will be described with reference to FIG. 7. FIG. 7 is a schematic diagram illustrating the configuration of the upper chuck 230 and the lower chuck 231 according to the exemplary embodiment.

As shown in FIG. 7, the upper chuck 230 has a main body 260. The main body 260 is supported by a supporting member 270. A through hole 266 is formed through the supporting member 270 and the main body 260 in a vertical direction. The position of this through hole 266 corresponds to the center of the upper wafer W1 attracted to and held by the upper chuck 230. A pressing pin 281 of a striker 280 is inserted into the through hole 266.

The striker 280 is disposed on a top surface of the supporting member 270, and is equipped with the pressing pin 281, an actuator 282, and a linearly moving mechanism 283. The pressing pin 281 is a columnar member extending in the vertical direction and is supported by the actuator 282.

The actuator 282 is configured to generate a constant pressure in a certain direction (here, vertically downwards) by air supplied from, for example, an electro-pneumatic regulator (not shown). By the air supplied from the electro-pneumatic regulator, the actuator 282 is capable of coming into contact with a central portion of the upper wafer W1 and controlling a pressing load applied to the central portion of the upper wafer W1. Further, a leading end of the pressing pin 281 is movable up and down in the vertical direction through the through hole 266 by the air from the electro-pneumatic regulator.

The actuator 282 is supported by the linearly moving mechanism 283. The linearly moving mechanism 283 moves the actuator 282 along the vertical direction by a driving unit having, for example, a motor embedded therein.

The striker 280 is configured as described above, and controls the movement of the actuator 282 by the linearly moving mechanism 283 and controls the pressing load on the upper wafer W1 from the pressing pin 281 by the actuator 282. Accordingly, the striker 280 presses the central portion of the upper wafer W1 held by the upper chuck 230 to bring it into contact with the lower wafer W2.

A plurality of pins 261 to be brought into contact with the top surface (non-bonding surface W1*n*) of the upper wafer W1 is provided on a bottom surface of the main body 260. Each of these pins 261 has a diameter of, e.g., 0.1 mm to 1 mm and a height of several tens of μm to several hundreds of μm. The pins 261 are evenly arranged at a distance of, e.g., 2 mm.

The upper chuck 230 is provided with a plurality of attraction members configured to attract the upper wafer W1 in some of the regions where the plurality of pins 261 are provided. Specifically, on the bottom surface of the main body 260 of the upper chuck 230, a plurality of outer attraction members 391 and a plurality of inner attraction members 392 are provided to attract the upper wafer W1 by vacuum-evacuation. The plurality of outer attraction members 391 and the plurality of inner attraction members 392 have arc-shaped attraction regions when viewed from the top. The outer attraction members 391 and the inner attraction members 392 have the same height as the pins 261.

The plurality of outer attraction members 391 are disposed at an outer periphery of the main body 260. These outer attraction members 391 are connected to a non-illustrated suction device such as a vacuum pump, and attract an outer peripheral portion of the upper wafer W1 by the vacuum-evacuation.

The plurality of inner attraction members 392 are arranged along a circumferential direction of the main body 260 at a radially inner side than the outer attraction members 391. The plurality of inner attraction members 392 are connected to a non-illustrated suction device such as a vacuum pump, and attract a region between the outer periphery and the central portion of the upper wafer W1 by the vacuum-evacuation.

The lower chuck 231 has a main body 290 having a diameter equal to or larger than the diameter of the lower wafer W2. Here, the lower chuck 231 is illustrated as having a larger diameter than the lower wafer W2. A top surface of the main body 290 is a facing surface that faces the bottom surface (non-bonding surface W2*n*) of the lower wafer W2.

A plurality of pins 291 to be brought into contact with the bottom surface (non-bonding surface W2_n_) of the lower wafer W2 is provided on the top surface of the main body 290. The pins 291 have a diameter of, e.g., 0.1 mm to 1 mm and a height of several tens of μm to several hundreds of μm. The plurality of pins 291 are evenly arranged at a distance of, e.g., 2 mm.

Further, a lower rib 292 is annularly provided on the top surface of the main body 290 to be located outside the plurality of pins 291. The lower rib 292 is formed in an annular shape and supports the outer periphery of the lower wafer W2 over the entire circumference thereof.

The main body 290 has a plurality of lower suction ports 293. The plurality of lower suction ports 293 are provided in a suction region surrounded by the lower rib 292. These lower suction ports 293 are connected to a non-illustrated suction device such as a vacuum pump via a non-illustrated suction line.

The lower chuck 231 decompresses the suction region surrounded by the lower rib 292 by vacuum-evacuating the suction region through the plurality of lower suction ports 293. As a result, the lower wafer W2 disposed in the suction region is attracted to and held by the lower chuck 231.

Since the lower rib 292 supports the outer periphery of the bottom surface of the lower wafer W2 over the entire circumference thereof, the outer periphery of the lower wafer W2 is properly vacuum-evacuated. Thus, the entire surface of the lower wafer W2 can be attracted and held. In addition, since the bottom surface of the lower wafer W2 is supported by the plurality of pins 291, the lower wafer W2 can be easily separated from the lower chuck 231 when the vacuum-evacuation of the lower wafer W2 is released.

<Specific Operation of Bonding System>

Figure 8:
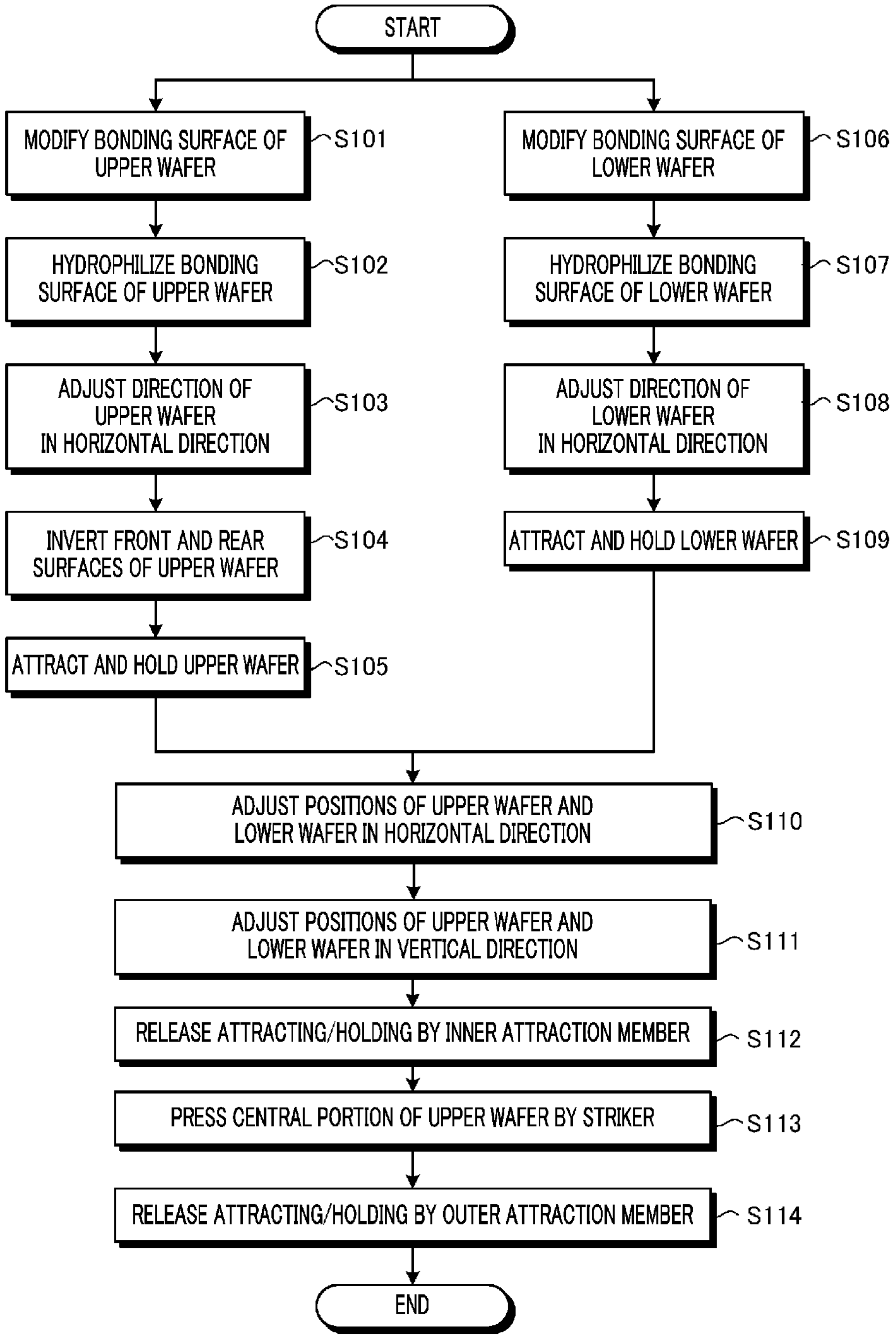
FIG. 8 is a flowchart illustrating a sequence of a processing performed by the bonding system according to the exemplary embodiment.

Now, a specific operation of the bonding system 1 according to the exemplary embodiment will be explained with reference to FIG. 8. FIG. 8 is a flowchart illustrating a sequence of a processing performed by the bonding system 1 according to the exemplary embodiment. Various processes shown in FIG. 8 are performed under the control of the controller 5 of the control device 4.

First, the cassette C1 accommodating therein the upper wafers W1, the cassette C2 accommodating therein the lower wafers W2, and the empty cassette C3 are placed on the preset placing plates 11 of the carry-in/out station 2. Then, the upper wafer W1 is taken out of the cassette C1 by the transfer device 22 and transferred to the transition device 50 of the third processing block G3.

Thereafter, the upper wafer W1 is transferred to the surface modifying apparatus 30 of the first processing block G1 by the transfer device 61. In the surface modifying apparatus 30, the nitrogen gas as the processing gas is excited into plasma under a preset decompressed atmosphere to be ionized. The nitrogen ions thus generated are radiated to the bonding surface W1_j_ of the upper wafer W1, so that the bonding surface W1_j_ is plasma-processed. Accordingly, the bonding surface W1_j_ of the upper wafer W1 is modified (process S101). Here, in the surface modifying apparatus 30 of the present exemplary embodiment, the amount of moisture in the processing vessel 70 is adjusted by supplying the humidified gas, and the bonding surface W1_j_ of the upper wafer W1 is modified by forming the plasma of the processing gas in the processing vessel 70 in the state that the amount of moisture in the processing vessel 70 is adjusted.

In this way, by modifying the bonding surface W1_j_ of the upper wafer W1 in the state that the amount of moisture in the processing vessel 70 is adjusted, a decrease in bonding strength between the upper wafer W1 and the lower wafer W2, which is obtained when the upper wafer W1 and the lower wafer W2 are bonded together, can be suppressed. Factors regarding the suppression of the decrease in the bonding strength between the upper wafer W1 and the lower wafer W2 will be described after the description of the various processes in the bonding system 1 is finished.

Subsequently, the upper wafer W1 is transferred to the surface hydrophilizing apparatus 40 of the second processing block G2_by the transfer device 61. In the surface hydrophilizing apparatus 40, while rotating the upper wafer W1 held by the spin chuck, pure water is supplied onto the upper wafer W1. As a result, the bonding surface W1_j_ of the upper wafer W1 is hydrophilized, and also cleaned by the pure water (process S102).

Next, the upper wafer W1 is transferred to the bonding apparatus 41 of the second processing block G2 by the transfer device 61. The wafer W1 carried into the bonding apparatus 41 is transferred to the position adjusting mechanism 210 via the transition device 200, and the direction of the upper wafer W1 in the horizontal direction is adjusted by the position adjusting mechanism 210 (process S103).

Thereafter, the upper wafer W1 is delivered from the position adjusting mechanism 210 to the inverting mechanism 220, and the front and rear surfaces of the upper wafer W1 are inverted by the inverting mechanism 220 (process S104). To be specific, the bonding surface W1_j_ of the upper wafer W1 is turned to face downwards.

Subsequently, the upper wafer W1 is sent from the inverting mechanism 220 to the upper chuck 230 to be attracted to and held by the upper chuck 230 (process S105).

In parallel with the processes S101 to S105 upon the upper wafer W1, the lower wafer W2 is also processed. First, the lower wafer W2 is taken out of the cassette C2 by the transfer device 22, and transferred to the transition device 50 of the third processing block G3.

Next, the lower wafer W2 is transferred to the surface modifying apparatus 30 by the transfer device 61, and the bonding surface W2_j_ of the lower wafer W2 is modified (process S106). The process S106 is the same as the process S101 described above, and is performed in the state that the amount of moisture in the processing vessel 70 is adjusted.

Thereafter, the lower wafer W2 is transferred to the surface hydrophilizing apparatus 40 by the transfer device 61, and the bonding surface W2_j_ of the lower wafer W2 is hydrophilized and cleaned (process S107).

Afterwards, the lower wafer W2 is transferred to the bonding apparatus 41 by the transfer device 61. The lower wafer W2 carried into the bonding apparatus 41 is transferred to the position adjusting mechanism 210 via the transition device 200. Then, the direction of the lower wafer W2 in the horizontal direction is adjusted by the position adjusting mechanism 210 (process S108).

Thereafter, the lower wafer W2 is transferred to the lower chuck 231, and is attracted to and held by the lower chuck 231 with the notch thereof directed toward a predetermined direction (process S109).

Subsequently, the position alignment of the upper wafer W1 held by the upper chuck 230 and the lower wafer W2 held by the lower chuck 231 in the horizontal direction is carried out (process S110).

Next, the position alignment of the upper wafer W1 held by the upper chuck 230 and the lower wafer W2 held by the lower chuck 231 in the vertical direction are carried out (process S111). Specifically, the first moving unit 250 moves the lower chuck 231 vertically upwards, thus bringing the lower wafer W2 closer to the upper wafer W1.

Next, after the attracting and holding of the upper wafer W1 by the plurality of inner attraction members 392 is released (process S112), the pressing pin 281 of the striker 280 is lowered to press the central portion of the upper wafer W1 (process S113).

When the central portion of the upper wafer W1 comes into contact with the central portion of the lower wafer W2 and the central portion of the upper wafer W1 and the central portion of the lower wafer W2 are pressed by the striker 280 with a preset force, the bonding is started between the pressed central portions of the upper wafer W1 and the lower wafer W2. Specifically, since the bonding surface W1*j* of the upper wafer W1 and the bonding surface W2*j* of the lower wafer W2 are modified, a van der Waals force (intermolecular force) is first generated between the bonding surfaces W1*j* and W2*j*, so that the bonding surfaces W1*j* and W2*j* are bonded to each other. Further, since the bonding surface W1*j* of the upper wafer W1 and the bonding surface W2*j* of the lower wafer W2 are hydrophilized, hydrophilic groups between the bonding surfaces W1*j* and W2*j* are hydrogen-bonded, so that the bonding surfaces W1*j* and W2*j* are firmly bonded to each other. In this way, a bonding region is formed.

Afterwards, a bonding wave occurs between the upper wafer W1 and the lower wafer W2, so that the bonding region expands from the central portions of the upper wafer W1 and the lower wafer W2 to the outer peripheries thereof. Thereafter, the attracting and holding of the upper wafer W1 by the plurality of outer attraction members 391 is released (process S114). Accordingly, the outer periphery of the upper wafer W1 attracted to and held by the outer attraction members 391 fall down. As a result, the entire bonding surface W1*j* of the upper wafer W1 and the entire bonding surface W2*j* of the lower wafer W2 come into contact with each other, so that the combined wafer T is formed.

Then, the pressing pin 281 is raised up to the upper chuck 230, and the attracting and holding of the lower wafer W2 by the lower chuck 231 is released. Thereafter, the combined wafer T is carried out from the bonding apparatus 41 by the transfer device 61. In this way, the series of processes of the bonding processing are ended.

Figure 9:
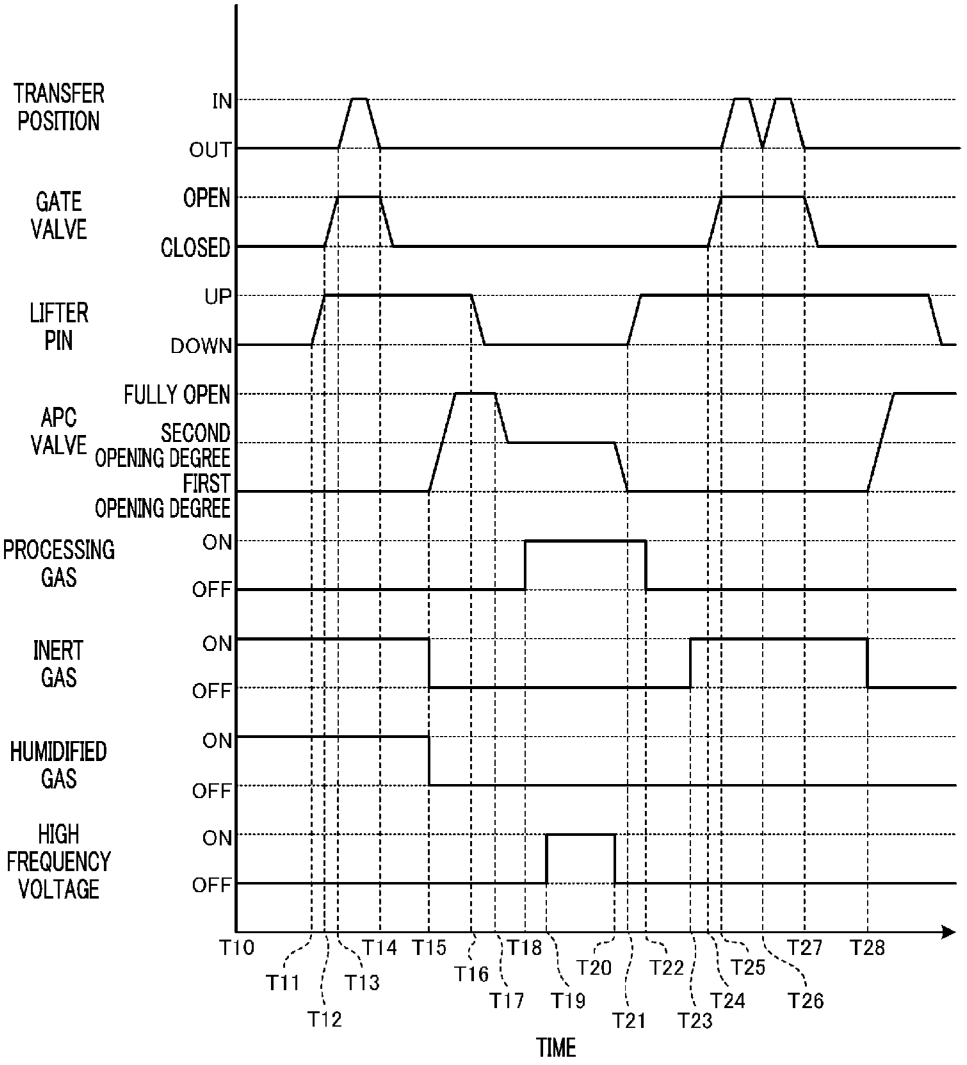
FIG. 9 is a timing chart illustrating operations of individual components when bonding surfaces of the upper wafer and the lower wafer are modified in a bonding processing according to the exemplary embodiment.

FIG. 9 is a timing chart showing the operations of the individual components when the bonding surface W1*j* of the upper wafer W1 and the bonding surface W2*j* of the lower wafer W2 are modified in the bonding processing according to the exemplary embodiment. FIG. 9 depicts a timing chart starting from a time point when the transfer of the upper wafer W1 to the surface modifying apparatus 30 is begun and before the above-described process 8101 (modification of the bonding surface W1*j* of the upper wafer W1) is started.

Through intensive research, the inventors have found that the formation of the dangling bonds in the bonding surface W1*j* of the upper wafer W1 and the bonding surface W2*j* of the lower wafer W2 are accelerated by adjusting the amount of moisture in the processing vessel 70 of the surface modifying apparatus 30. Thus, in the surface modifying apparatus 30 according to the present exemplary embodiment, the amount of moisture in the processing vessel 70 is adjusted by supplying the humidified gas into the processing vessel 70 prior to performing the surface modification of the upper wafer W1.

The controller 5 operates the inert gas supply mechanism 123 to supply the inert gas into the processing vessel 70 from a time T10 when the transfer of the upper wafer W1 to the surface modifying apparatus 30 is started.

Further, the controller 5 operates the humidified gas supply mechanism 124 from the time T10 to supply the humidified gas into the processing vessel 70 together with the inert gas.

Furthermore, when supplying the humidified gas into the processing vessel 70, the controller 5 may measure a value representing the amount of moisture in the processing vessel 70 by using the spectrophotometer 141 or the mass spectrometer 142. In this case, the controller 5 may control the flow rate or the moisture content of the humidified gas based on the measured value indicating the amount of moisture in the processing vessel 70.

Figure 10:
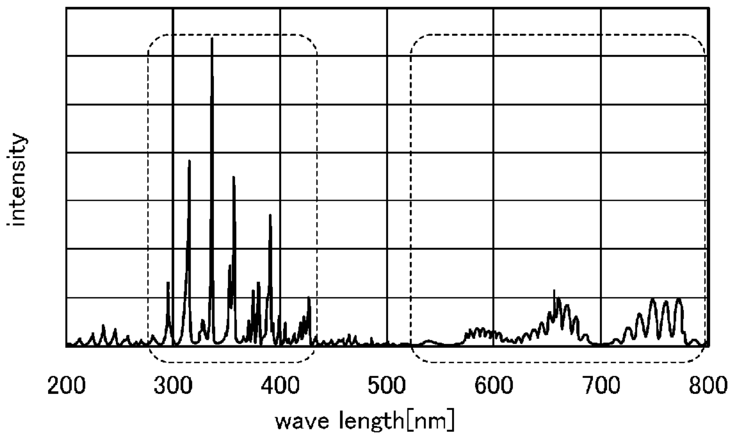
FIG. 10 is a diagram for describing an example of a measurement result of an amount of moisture in a processing vessel.
Figure 11:
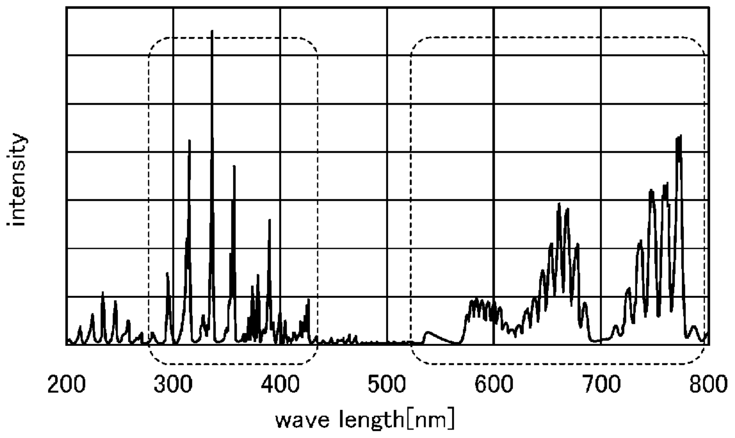
FIG. 11 is a diagram for describing an example of the measurement result of the amount of moisture in the processing vessel.

FIG. 10 and FIG. 11 are diagrams for explaining an example of a measurement result of the amount of moisture in the processing vessel 70. FIG. 10 shows light emission data of wavelengths within the processing vessel 70 immediately after it is opened to the air during maintenance. FIG. 10 shows the light emission data measured by the spectrophotometer 141 when the plasma of the nitrogen gas as the processing gas is formed in the processing vessel 70. The plasma of the nitrogen gas contains nitrogen ions of a first excitation level (first POS) and nitrogen ions of a second excitation level (second POS) having higher activity than the nitrogen ions of the first excitation level. The wavelength of the nitrogen ion of the first excitation level is within a range of about 530 nm to 800 nm, and the wavelength of the nitrogen ion of the second excitation level is within a range of about 280 nm to 440 nm. The light emission data shown in FIG. 10 indicate that almost no nitrogen ions of the first excitation level are generated when the processing vessel 70 is opened to the air during the maintenance. This is deemed to be because the nitrogen ions of the first excitation level are extinguished from the inside of the processing vessel 70 as the amount of moisture in the processing vessel 70 rises due to the opening to the air and the energy of the nitrogen ions of the first excitation level is transferred to the moisture ($H_2O$) existing in the processing vessel 70.

FIG. 11 shows light emission data of wavelengths within the processing vessel 70 after the surface modification of the upper wafer W1 is repeatedly performed a predetermined number of times. FIG. 11 shows the light emission data measured by the spectrophotometer 141 when the plasma of the nitrogen gas as the processing gas is formed in the processing vessel 70. The light emission data shown in FIG. 11 indicate that the amount of the nitrogen ions of the first excitation level increases when the surface modification of the upper wafer W1 is repeatedly performed in the processing vessel 70. This is deemed to be because when the surface modification is performed repeatedly, the amount of moisture in the processing vessel 70 decreases due to the vacuum-evacuation or the like, so that the energy of the nitrogen ions of the first excitation level is difficult to transfer to the moisture ($H_2O$), which results in the increase of the remaining nitrogen ions of the first excitation level.

The controller 5 controls the spectrophotometer 141 and the processing gas supply mechanism 122 to acquire the light emission data within the processing vessel 70, and obtains a peak value, among the light emission data, appearing at a wavelength corresponding to the nitrogen ion of the first excitation level as a value representing the amount of moisture in the processing vessel 70. Then, the controller 5 controls the flow rate or the moisture content of the humidified gas based on the measured peak value appearing at the wavelength corresponding to the nitrogen ion of the first excitation level. As the amount of moisture in the processing vessel 70 decreases, the peak value appearing at the wavelength corresponding to the nitrogen ion of the first excitation level in the light emission data acquired from the spectrophotometer 141 increases. For this reason, it is possible to determine whether or not the amount of moisture in the processing vessel 70 has decreased to less than a predetermined lower limit based on the peak value appearing at the wavelength corresponding to the nitrogen ion of the first excitation level. For example, the controller 5 may determine whether or not the amount of moisture in the processing vessel 70 falls below the predetermined lower limit by determining whether the measured peak value is equal to or larger than a preset threshold value. Then, if the amount of moisture in the processing vessel 70 is found to be less than the predetermined lower limit, the controller 5 controls the humidified gas supply mechanism 124 to increase the flow rate or the moisture content of the humidified gas. In this way, the controller 5 is capable of adjusting the amount of moisture in the processing vessel 70 appropriately.

Figure 12:
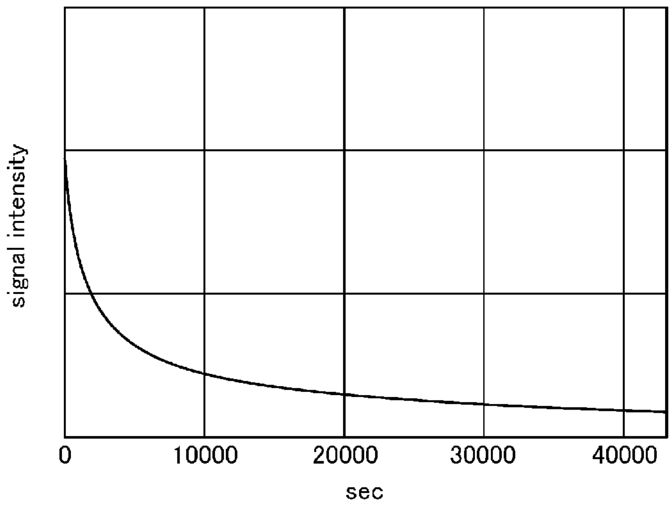
FIG. 12 is a diagram for describing another example of the measurement result of the amount of moisture in the processing vessel.

FIG. 12 is a diagram for explaining another example of the measurement result of the amount of moisture in the processing vessel 70. FIG. 12 shows data of analysis values obtained by analyzing the atmosphere in the processing vessel 70 in terms of a mass number of water ($H_2O$) (m/z=18) in case of performing the vacuum-evacuation from the inside of the processing vessel 70 after the processing vessel 70 is opened to the air. FIG. 12 shows the data of the analysis values measured by the mass spectrometer 142. The data of the analysis values shown in FIG. 12 indicate that when the surface modification of the upper wafer W1 is repeatedly performed in the processing vessel 70 the predetermined number of times, the amount of moisture in the processing vessel 70 gradually decreases due to the vacuum-evacuation.

The controller 5 measures the analysis value measured by the mass spectrometer 142 as a value representing the amount of moisture in the processing vessel 70. Then, the controller 5 controls the flow rate or the moisture content of the humidified gas based on the measured analysis value. With a decrease of the amount of moisture in the processing vessel 70, the analysis value of the mass spectrometer 142 decreases. For example, the controller 5 may determine whether or not the amount of moisture in the processing vessel 70 falls below the predetermined lower limit by determining whether the measured analysis value is equal to or less than a preset threshold value. Then, if the amount of moisture in the processing vessel 70 is found to be less than the predetermined lower limit, the controller 5 controls the humidified gas supply mechanism 124 to increase the flow rate or the moisture content of the humidified gas. In this way, the controller 5 is capable of appropriately adjusting the amount of moisture in the processing vessel 70.

Reference is made back to FIG. 9. The controller 5 raises the lifter pins from the stage 80 at a time T11 upon the lapse of a preset time from the time T10, and opens the gate valve 72 at a time T12 upon the lapse of a predetermined time from the time T11. The controller 5 advances the transfer arm of the transfer device 61 into the processing vessel 70 at a time T13 upon the lapse of a preset time from the time T12 to deliver the upper wafer W1 held on the transfer arm to the lifter pins. The controller 5 closes the gate valve 72 at a time T14 when the transfer arm of the transfer device 61 is retreated from the inside of the processing vessel 70. Then, the controller 5 stops the inert gas supply mechanism 123 at a time T15 upon the lapse of a predetermined time from the time T14 to end the transfer of the upper wafer W1 into the processing vessel 70. The period from the time T10 to the time T15 is called "standby period".

The controller 5 stops the humidified gas supply mechanism 124 at the time T15. That is, during the standby period, the controller 5 adjusts the amount of moisture in the processing vessel 70 by supplying the humidified gas into the processing vessel 70. The amount of moisture in the processing vessel 70 is adjusted to fall within a range of, e.g., 1000 ppm to 5000 ppm.

In addition, the controller 5 adjusts the opening degree of the APC valve 133 from a first opening degree, which is an initial value, to a fully open state from the time T15, which is the end of the standby period, to thereby vacuum-evacuate the inside of the processing vessel 70. Then, the controller 5 lowers the lifter pins toward the stage 80 at a time T16 upon the lapse of a predetermined time from the time T15, thus allowing the upper wafer W1 to be placed on the stage 80.

From a time T17 upon the lapse of a preset time from the time T16, the controller 5 adjusts the opening degree of the APC valve 133 from the fully open state to a second opening degree larger than the first opening degree, to thereby set a pressure inside the processing vessel 70 to a process pressure for a surface modification process.

After the pressure inside the processing vessel 70 reaches the process pressure, the controller 5 operates the processing gas supply mechanism 122 from a time T18 to supply the nitrogen gas as the processing gas into the processing vessel 70. Then, the controller 5 controls the first high frequency power supply 106 to apply the high frequency power to the stage 80 at a time T19 upon the lapse of a preset time from the time T18, so that the plasma of the nitrogen gas is formed within the processing vessel 70.

The nitrogen ions in the plasma thus formed are radiated to the bonding surface W1*j* of the upper wafer W1, so that the bonding surface W1*j* is modified. As a result, dangling bonds of silicon atoms are formed in the outermost surface of the bonding surface W1*j*.

The controller 5 stops the first high frequency power supply 106 at a time T20 after a predetermined time elapses from the time T19, and adjusts the opening degree of the APC valve 133 from the second opening degree to the first opening degree to lower the pressure inside the processing vessel 70 to the initial pressure. Then, at a time T21 when the pressure inside the processing vessel 70 reaches the initial pressure, the controller 5 raises the lifter pins from the stage 80, thus allowing the modified upper wafer W1 to be placed above the stage 80. Then, the controller 5 stops the processing gas supply mechanism 122 at a time T22 upon the lapse of a predetermined time from the time T21.

At a time T23 after a preset time elapses from the time T22, the controller 5 operates the inert gas supply mechanism 123 to supply the inert gas into the processing vessel 70. Through this operation, the controller 5 replaces the nitrogen gas remaining in the processing vessel 70 with the inert gas. Then, at a time T24 upon the lapse of a predetermined time the time T23, the controller 5 completely replaces the nitrogen gas remaining in the processing vessel 70 with the inert gas, thus completing the modification of the bonding surface W1*j* of the upper wafer W1. Hereinafter, the period from the time T15, which is the end of the standby period, to the time T24 is appropriately referred to as "first process period".

The controller 5 opens the gate valve 72 at the time T24 which is the end of the first process period. The controller 5 advances the transfer arm of the transfer device 61 into the processing vessel 70 at a time T25 upon the lapse of a predetermined time from the time T24, and delivers the modified upper wafer W1 placed above the stage 80 to the transfer arm. Thereafter, the controller 5 transfers the modified upper wafer W1 to the surface hydrophilizing apparatus 40 by the transfer device 61.

Once the upper wafer W1 after being modified is transferred to the surface hydrophilizing apparatus 40, a transfer of the lower wafer W2 before being modified to the surface modifying apparatus 30 is started. That is, the controller 5 controls the transfer arm of the transfer device 61 to hold the lower wafer W2 thereon, and then moves the transfer device 61 to the surface modifying apparatus 30. Then, at a time T26 when the transfer device 61 arrives at the surface modifying apparatus 30, the controller 5 advances the transfer arm of the transfer device 61 into the processing vessel 70 and hands the lower wafer W2 held by the transfer arm over to the lifter pins. The controller 5 then closes the gate valve 72 at a time T27 when the transfer arm of the transfer device 61 is retreated from the inside of the processing vessel 70. Thereafter, the controller 5 stands by until a time T28 upon the lapse of a predetermined time from the time T27. In this way, during the period from the time T24 to the time T28, the lower wafer W2 before being modified is carried into the processing vessel 70 in place of the upper wafer W1 after being modified. Hereinafter, the period from the time T24, which is the end of the first process period, to the time T28 is appropriately referred to as "wafer replacement period". After the time T28 which is the end of the wafer replacement period, a processing upon the lower wafer W2 is performed in the same way as in the processing on the upper wafer W1 during the first process period. As a result, the bonding surface W2*j* of the lower wafer W2 is modified. Hereinafter, the period from the time T28, which is the end of the wafer replacement period, to a time when the modification of the bonding surface W2*j* of the lower wafer W2 is completed is appropriately referred to as "second process period". When the second process period ends, the controller 5 may take out the modified lower wafer W2 from the surface modifying apparatus 30 by the transfer device 61.

As described above, in the exemplary embodiment, by modifying the bonding surface W1*j* of the upper wafer W1 in the state that the amount of moisture in the processing vessel 70 is adjusted, the decrease in the bonding strength between the upper wafer W1 and the lower wafer W2 to be bonded to each other may be suppressed.

<Reason why Decrease in Bonding Strength Between Wafers is Suppressed>

Hereinafter, the reason why the decrease in the bonding strength between the upper wafer W1 and the lower wafer W2 to be bonded to each other is suppressed by modifying the bonding surface W1*j* of the upper wafer W1 in the state that the amount of moisture in the processing vessel 70 is adjusted will be discussed.

That is, in the present exemplary embodiment, the amount of moisture in the processing vessel 70 is adjusted prior to the modification of the upper wafer W1 by supplying the humidified gas into the processing vessel 70 accommodating the upper wafer W1 therein. Accordingly, the amount of moisture in the processing vessel 70 increases, creating a state in which a large amount of moisture ($H_2O$) exists near the bonding surface W1*j* of the upper wafer W1.

In this state, the surface modification process by the plasma of the nitrogen gas as the processing gas is performed on the upper wafer W1. At this time, among the nitrogen ions of the first excitation level and the nitrogen ions of the second excitation level included in the plasma of the nitrogen gas, the energy of the nitrogen ions of the first excitation level with relatively low activity are transferred to the moisture ($H_2O$) existing near the bonding surface W1*j*.

Accordingly, the nitrogen ions of the first excitation level are extinguished from the inside of the processing vessel 70, whereas the ratio of the nitrogen ions of the second excitation level, which has higher activity than the nitrogen ions of the first excitation level, increases. As a result, it is possible to radiate the nitrogen ions of the second excitation level having a relatively high activity to the bonding surface W1*j* while suppressing nitridation by the nitrogen ions of the first excitation level, so that the formation of the dangling bonds of the silicon atoms in the outermost surface of the bonding surface W1*j* can be accelerated. Meanwhile, on the outermost surface of the bonding surface W1*j*, since the nitridation by the nitrogen ions of the first excitation level is suppressed, formation of a nitridated portion is reduced.

In this state, if the upper wafer W1 is carried out from the surface modifying apparatus 30 and exposed to the atmospheric atmosphere, the dangling bonds of the silicon atoms are terminated with OH groups due to the moisture ($H_2O$) in the air.

Here, since the formation of the nitridated portion on the outermost surface of the bonding surface W1*j* is reduced, the formation of the OH groups is not inhibited by this nitridated portion.

Next, the bonding surface W1*j* of the upper wafer W1 and the bonding surface W2*j* of the lower wafer W2 carried out from the surface modifying apparatus 30 are hydrophilized by the surface hydrophilizing apparatus 40, and then bonded to each other by the bonding apparatus 41. In this bonding processing, the bonding progresses from the center toward the edge of the wafer W by hydrogen bonding between the OH groups of the bonding surface W1*j* and the OH groups of the bonding surface W2*j*.

In the present exemplary embodiment, since the formation of the nitridated portion on the outermost surface of the bonding surface W1*j* is reduced, the above-described bonding by the OH groups is not inhibited by this nitridated portion. That is, in the present exemplary embodiment, by adjusting the amount of moisture in the processing vessel 70, the formation of the nitridated portion, which inhibits formation of a Si—O—Si bond originating from the OH groups, can be suppressed. Therefore, according to the present exemplary embodiment, the decrease in the bonding strength between the upper wafer W1 and the lower wafer W2 to be bonded to each other can be suppressed.

First Modification Example

Figure 13:
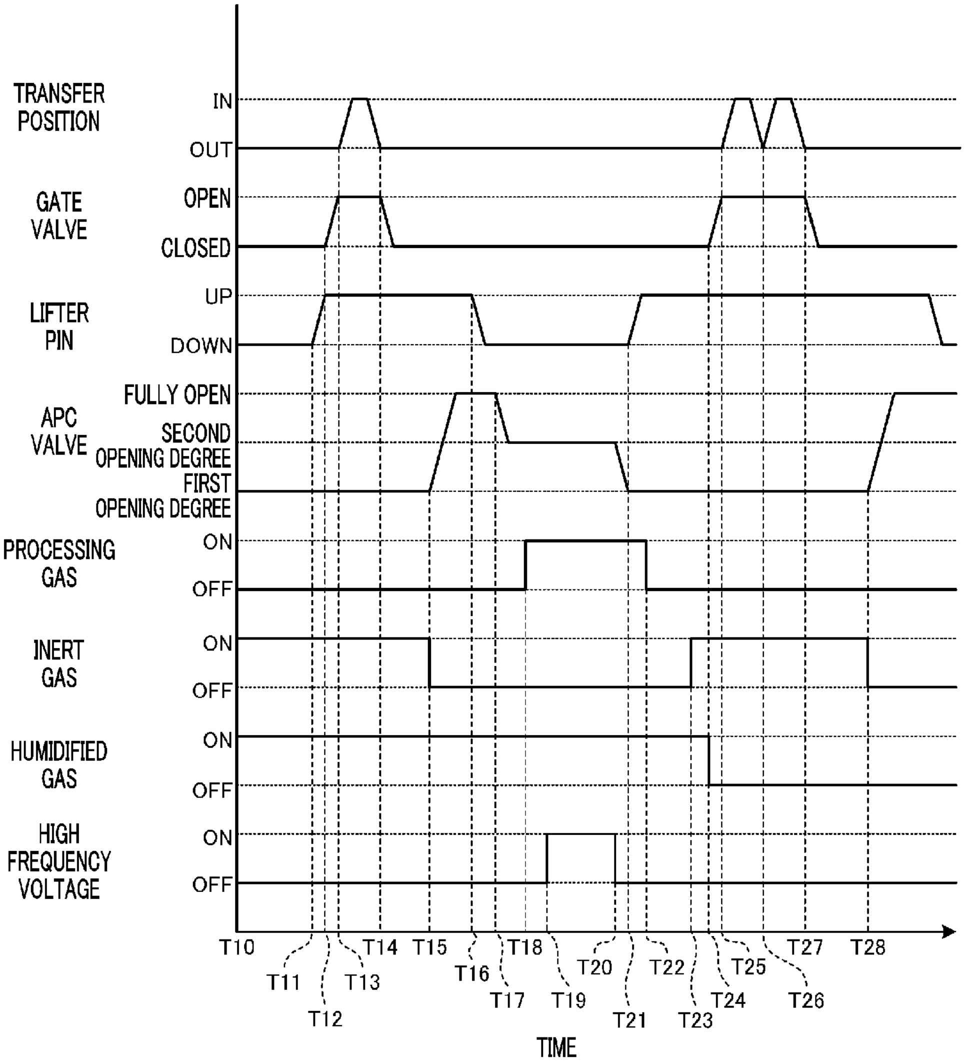
FIG. 13 is a timing chart showing operations of the individual components when the bonding surfaces of the upper wafer and the lower wafer are modified in a bonding processing according to a first modification example of the exemplary embodiment.

Now, various modification examples of the exemplary embodiment will be explained with reference to FIG. 13 to FIG. 15. FIG. 13 is a timing chart showing operations of the individual components when the bonding surface W1*j* of the upper wafer W1 and the bonding surface W2*j* of the lower wafer W2 are modified in a bonding processing according to a first modification example of the exemplary embodiment. FIG. 13 presents the timing chart starting from a time point when the transfer of the upper wafer W1 to the surface modifying apparatus 30 is begun and before the above-described process S101 (modification of the bonding surface W1*j* of the upper wafer W1) is started.

The controller 5 controls the inert gas supply mechanism 123 to supply the inert gas into the processing vessel 70 from the time point when the transfer of the upper wafer W1 to the surface modifying apparatus 30 is begun.

Further, the controller 5 operates the humidified gas supply mechanism 124 to supply the humidified gas into the processing vessel 70 together with the inert gas from the time T10.

The controller 5 raises the lifter pins from the stage 80 at the time T11 upon the lapse of the preset time from the time T10, and opens the gate valve 72 at the time T12 upon the lapse of the predetermined time from the time T11. The controller 5 advances the transfer arm of the transfer device 61 into the processing vessel 70 at the time T13 upon the lapse of the preset time from the time T12, and delivers the upper wafer W1 held on the transfer arm onto the lifter pins. The controller 5 closes the gate valve 72 at the time T14 when the transfer arm of the transfer device 61 is retreated from the inside of the processing vessel 70. The controller 5 then stops the inert gas supply mechanism 123 at the time T15 upon the lapse of the predetermined time from the time T14 to end the transfer of the upper wafer W1 into the processing vessel 70.

Further, the controller 5 carries on the supply of the humidified gas into the processing vessel 70 without stopping the humidified gas supply mechanism 124 even after the time T15 which is the end of the standby period. That is, in the first modification example, the controller 5 continues to supply the humidified gas into the processing vessel 70 even after the standby period passes by.

The controller 5 vacuum-evacuates the inside of the processing vessel 70 by adjusting the opening degree of the APC valve 133 from the first opening degree, which is the initial value, to the fully open state, starting from the time T15 which is the end of the standby period. Then, the controller 5 lowers the lifter pins toward the stage 80 at the time T16 upon the lapse of the predetermined time from the time T15, thus allowing the upper wafer W1 to be placed on the stage 80.

The controller 5 adjusts the opening degree of the APC valve 133 from the fully open state to the second opening degree larger than the first opening degree from the time T17 after the predetermined time elapses from the time T16, so that the pressure inside the processing vessel 70 is set to the process pressure for the surface modification process.

After the pressure inside the processing vessel 70 reaches the process pressure, the controller 5 operates the processing gas supply mechanism 122 from the time T18 to supply the nitrogen gas as the processing gas into the processing vessel 70. Then, the controller 5 controls the first high frequency power supply 106 to apply the high frequency power to the stage 80 at the time T19 upon the lapse of the preset time from the time T18, so that the plasma of the nitrogen gas is formed in the processing vessel 70.

The nitrogen ions in the plasma thus formed are radiated to the bonding surface W1*j* of the upper wafer W1, so that the bonding surface W1*j* is modified. As a result, the dangling bonds of the silicon atoms are formed in the outermost surface of the bonding surface W1*j*.

The controller 5 stops the first high frequency power supply 106 at the time T20 upon the lapse of the predetermined time from the time T19, and adjusts the opening degree of the APC valve 133 from the second opening degree to the first opening degree to lower the pressure inside the processing vessel 70 to the initial pressure. Then, at the time T21 when the pressure inside the processing vessel 70 reaches the initial pressure, the controller 5 raises the lifter pin from the stage 80 to place the modified upper wafer W1 above the stage 80. Thereafter, the controller 5 stops the processing gas supply mechanism 122 at the time T22 upon the lapse of the predetermined time from the time T21.

The controller 5 operates the inert gas supply mechanism 123 to supply the inert gas into the processing vessel 70 at the time T23 after the preset time passes by from the time T22. Through this operation, the controller 5 replaces the nitrogen gas remaining in the processing vessel 70 with the inert gas. Then, at the time T24 upon the lapse of the predetermined time from the time T23, the controller 5 completely replaces the nitrogen gas remaining in the processing vessel 70 with the inert gas, thus completing the modification of the bonding surface W1*j* of the upper wafer W1.

Furthermore, the controller 5 stops the humidified gas supply mechanism 124 at the time T24 when the modification of the bonding surface W1*j* of the upper wafer W1 is completed.

That is, in the first modification example, the controller 5 carries on the supply of the humidified gas into the processing vessel 70 during the first process period ranging from the time T15, which is the end of the standby period, to the time T24 when the modification of the bonding surface W1*j* of the upper wafer W1 is completed.

Accordingly, the controller 5 is capable of continuously adjusting the amount of moisture in the processing vessel 70 in the first process period following the standby period. Therefore, according to the first modification example, since the formation of the nitridated portion which may inhibit the bonding by the OH groups in the outermost surface of the bonding surface W1*j* can be more efficiently reduced, so that the decrease in the bonding strength between the upper wafer W1 and the lower wafer W2 to be bonded to each other can be more efficiently suppressed.

Then, the controller 5 opens the gate valve 72 at the time T24 which is the end of the first process period. Since the processings that follows are the same as in the above-described exemplary embodiment, detailed description thereof will be omitted.

Second Modification Example

A second modification example is different from the first modification example in that the humidified gas is further supplied into the processing vessel 70 after the time T28, which is the end of the wafer replacement period. Since the second modification example is the same as the first modification example except for this, redundant description will be omitted.

Figure 14:
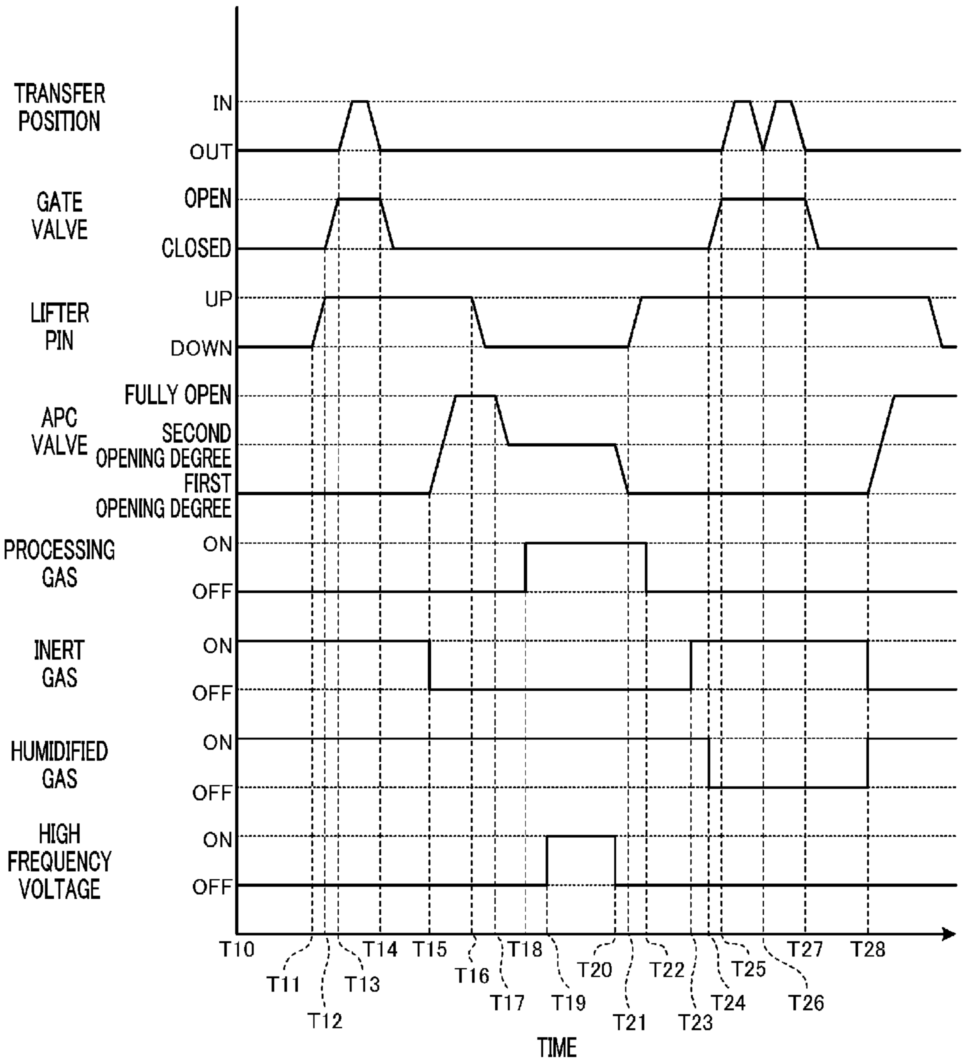
FIG. 14 is a timing chart showing operations of the individual components when the bonding surfaces of the upper wafer and the lower wafer are modified in a bonding processing according to a second modification example of the exemplary embodiment.

FIG. 14 is a timing chart showing operations of the individual components when the bonding surface W1*j* of the upper wafer W1 and the bonding surface W2*j* of the lower wafer W2 are modified in a bonding processing according to the second modification example of the exemplary embodiment. FIG. 14 presents the timing chart starting from the time point when the transfer of the upper wafer W1 to the surface modifying apparatus 30 is begun and before the above-described process S101 (modification of the bonding surface W1*j* of the upper wafer W1) is started.

The controller 5 operates the humidified gas supply mechanism 124 to supply the humidified gas into the processing vessel 70 from the time T28, which is the end of the wafer replacement period. Then, the controller 5 stops the humidified gas supply mechanism 124 at the time point when the modification of the bonding surface W2*j* of the lower wafer W2 is completed.

That is, in the second modification example, the humidified gas is further supplied into the processing vessel 70 during the second process period ranging from the time T28, which is the end of the wafer replacement period, to the time point when the modification of the bonding surface W2*j* of the lower wafer W2 is completed.

Accordingly, the controller 5 is capable of further adjusting the amount of moisture in the processing vessel 70 in the second process period following the wafer replacement period. Therefore, according to the second modification example, since the formation of the nitridated portion that may inhibit the bonding by the OH groups in the outermost surface of the bonding surface W2*j* can be more efficiently reduced, so that the decrease in the bonding strength between the upper wafer W1 and the lower wafer W2 to be bonded to each other can be more efficiently suppressed.

Third Modification Example

In the above-described exemplary embodiment, when adjusting the amount of moisture in the processing vessel 70, the value representing the amount of moisture in the processing vessel 70 is measured, and the flow rate or the moisture content of the humidified gas is controlled based on this measurement result. However, the value representing the amount of moisture in the processing vessel 70 may be measured after the amount of moisture in the processing vessel 70 is adjusted, and a determination upon whether or not the modification of the bonding surface W1*j* of the upper wafer W1 and the bonding surface W2*j* of the lower wafer W2 can be performed may be made based on that measurement result. In this regard, a third modification example will be described for an example in which the value indicating the amount of moisture in the processing vessel 70 is measured after the amount of moisture in the processing vessel 70 is adjusted, and a determination upon whether or not the modification of the bonding surface W1*j* of the upper wafer W1 and the bonding surface W2*j* of the lower wafer W2 is possible is made based on the measurement result.

Figure 15:
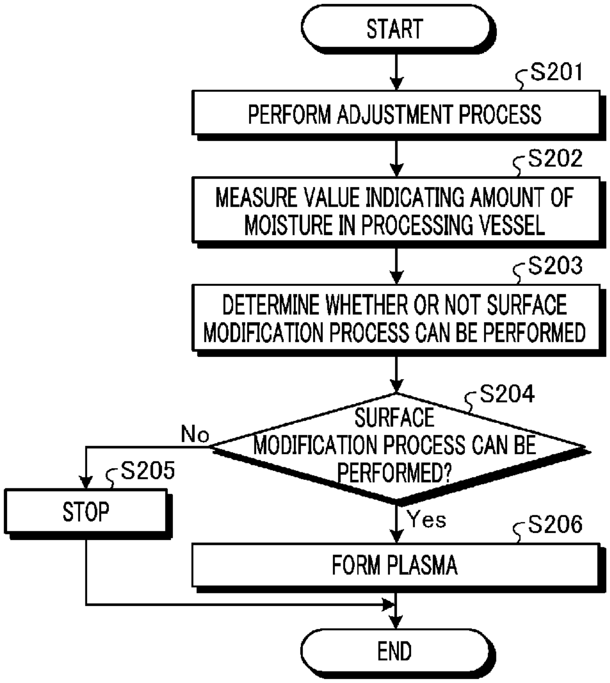
FIG. 15 is a flowchart illustrating an example of a processing flow of a method of determining whether modification according to a third modification example of the exemplary embodiment can be performed.

FIG. 15 is a flowchart showing an example of a processing flow of a method of determining whether the modification is possible according to the third modification example of the exemplary embodiment. FIG. 15 presents the flowchart starting form a time point when the processing (adjustment of the amount of moisture in the processing vessel 70) at the time T15 shown in FIG. 9 is completed.

If the adjustment of the amount of moisture in the processing vessel 70 is finished by stopping the humidified gas supply mechanism 24 (process S201), the controller 5 measures a value representing the amount of moisture in the processing vessel 70 (process S202). The value representing the amount of moisture in the processing vessel 70 is, by way of example, the peak value appearing at the wavelength corresponding to the nitrogen ions of the first excitation level in the light emission data measured by the spectrophotometer 141. Alternatively, the value representing the amount of moisture in the processing vessel 70 may be the analysis value measured by the mass spectrometer 142, that is, the analysis value obtained by analyzing the atmosphere within the processing vessel 70 in terms of the mass number of water ($H_2O$) (m/z=18).

Next, the controller 5 determines whether or not the modification of the bonding surface W1*j* of the upper wafer W1 and the bonding surface W2*j* of the lower wafer W2 (that is, the surface modification process) can be carried out based on the measured value representing the amount of moisture in the processing vessel 70 (process S203). For example, it is assumed that the value representing the amount of moisture in the processing vessel 70 is the peak value appearing at the wavelength corresponding to the nitrogen ions of the first excitation level. By way of example, when the measured peak value is equal to or larger than a predetermined threshold value, the controller 5 makes a determination that the surface modification process cannot be performed because it is estimated that the amount of moisture in the processing vessel 70 is less than the predetermined lower limit. Meanwhile, when the measured peak value is smaller than the predetermined threshold value, the controller 5 may make a determination that the surface modification process is possible because it is estimated that the amount of moisture in the processing vessel 70 is not less than the predetermined lower limit.

When it is determined that the surface modification process cannot be performed (process S204; No), the controller 5 stops the execution of the surface modification process (process S205) and ends the processing.

Meanwhile, when it is determined that the surface modification process is possible (process S205; Yes), the controller 5 proceeds to the process after the time T15 shown in FIG. 9, and forms the plasma of the processing gas in the processing vessel 70 (process S206). As a result, the bonding surface W1*j* of the upper wafer W1 and the bonding surface W2*j* of the lower wafer W2 are modified.

Therefore, according to the third modification example, it is possible to determine whether or not the surface modification process is possible based on the value indicating the amount of moisture in the processing vessel 70 which is measured after the amount of moisture in the processing vessel 70 is adjusted.

<Effects>

A surface modifying method according to the exemplary embodiment is a method of modifying a bonding surface (for example, the bonding surface W1*j*) of a substrate (for example, the upper wafer W1) to be bonded to another substrate (for example, the lower wafer W2) by plasma of a processing gas. This surface modifying method includes adjusting an amount of moisture and modifying the bonding surface of the substrate. In the adjusting of the amount of moisture, the amount of moisture in a processing vessel (for example, the processing vessel 70) is adjusted by supplying a humidified gas into the processing vessel allowed to accommodate therein the substrates. In the modifying of the bonding surface of the substrate, the bonding surface of the substrate is modified by forming the plasma of the processing gas in the processing vessel in the state that the amount of moisture in the processing vessel is adjusted. Accordingly, the decrease in bonding strength between the substrates to be bonded to each other can be suppressed.

Further, in the adjusting of the amount of moisture, the humidified gas may be supplied into the processing vessel during a first period (for example, the standby period) from when the transfer of the substrate into the processing vessel is begun until the substrate is carried into the processing vessel. As a result, it is possible to reduce the formation of the chemically reacted portion (for example, the nitridated portion) that may inhibit the bonding by the OH groups on the outermost surface of the bonding surface when the surface modification process is performed. Therefore, the decrease in the bonding strength can be efficiently suppressed.

Furthermore, in the adjusting of the amount of moisture, the humidified gas may be continuously supplied during a second period (for example, the first process period) from an end of the first period until the bonding surface of the substrate is completely modified. Accordingly, when the surface modification process is performed, the formation of the chemically reacted portion (for example, the nitridated portion) that may inhibit the bonding by the OH groups on the outermost surface of the bonding surface can be more efficiently reduced. Therefore, the decrease in the bonding strength can be more efficiently suppressed.

In addition, in the adjusting of the amount of moisture, the humidified gas may be further supplied into the processing vessel during a third period (for example, the second process period) from when the another substrate before being modified is carried into the processing vessel in place of the substrate after being modified until a bonding surface of the another substrate is completely modified. Accordingly, when the surface modification process is performed, the formation of the chemically reacted portion (for example, the nitridated portion) that may inhibit the bonding by the OH groups on the outermost surface of the bonding surface can be more efficiently reduced. Therefore, the decrease in the bonding strength can be more efficiently suppressed.

Moreover, the surface modifying method according to the exemplary embodiment may further include measuring a value. In the measuring of the value, a value indicating the amount of moisture in the processing vessel while performing the adjusting of the amount of moisture may be measured. In the adjusting of the amount of moisture, a flow rate or a moisture content of the humidified gas may be controlled based on the value indicating the amount of moisture in the processing vessel obtained in the measuring of the value. Thus, the amount of moisture in the processing vessel can be appropriately adjusted.

Additionally, the surface modifying method according to the exemplary embodiment may further include measuring a value; and determining. In the measuring of the value, a value indicating the amount of moisture in the processing vessel after the adjusting of the amount of moisture may be measured. In the determining, a determination upon whether or not the modifying of the bonding surface of the substrate is allowed to be performed may be made based on the value indicating the amount of moisture in the processing vessel, which is measured in the measuring of the value. Further, if it is determined in the determining that the modifying of the bonding surface of the substrate is allowed to be performed, the plasma of the processing gas may be formed in the processing vessel. In this way, it is possible to appropriately determine whether or not the surface modification process can be performed based on the value indicating the amount of moisture in the processing vessel which is measured after the amount of moisture in the processing vessel is adjusted.

In addition, the processing gas may be at least any one of an oxygen gas, a nitrogen gas, or an argon gas. Thus, even when the bonding surfaces of the substrates is modified by plasma of various processing gases, the decrease in the bonding strength between the substrates to be bonded can be suppressed.

It should be noted that the above-described exemplary embodiment is illustrative in all aspects and is not anyway limiting. The above-described exemplary embodiment may be omitted, replaced and modified in various ways without departing from the scope and the spirit of claims.

By way of example, the exemplary embodiment has been described for the case where the humidified gas is supplied into the processing vessel 70 by operating the humidified gas supply mechanism 124. However, the present disclosure is not limited thereto. For example, by opening the processing vessel 70 to the air, a moisture-containing gas in the air may be supplied into the processing vessel 70 as the humidified gas. Furthermore, the opening of the processing vessel 70 to the air may be performed during the wafer replacement period.

According to the exemplary embodiments, it is possible to suppress the decrease in bonding strength between the substrates to be bonded.

We claim:

1. A surface modifying method of modifying a bonding surface of a substrate to be bonded to another substrate by plasma of a processing gas, the surface modifying method comprising:

adjusting an amount of moisture in a processing vessel by supplying a humidified gas into the processing vessel configured to accommodate the substrate therein;

modifying the bonding surface of the substrate by forming the plasma of the processing gas in the processing vessel in a state that the amount of moisture in the processing vessel is adjusted; and measuring a value indicating the amount of moisture in the processing vessel while performing the adjusting of the amount of moisture, wherein the measuring of the value comprises acquiring light emission data of the processing gas supplied into the processing vessel and measuring, as the value indicating the amount of moisture in the processing vessel, a peak value generated at a specific wavelength in the light emission data, and wherein, in the adjusting of the amount of moisture, a flow rate or a moisture content of the humidified gas is controlled based on the peak value generated at the specific wavelength in the light emission data, which is measured in the measuring of the value.

2. The surface modifying method of claim 1, wherein, in the adjusting of the amount of moisture, the humidified gas is supplied into the processing vessel during a first period from when a transfer of the substrate into the processing vessel is begun until the substrate is carried into the processing vessel.

3. The surface modifying method of claim 2, wherein, in the adjusting of the amount of moisture, the humidified gas is continuously supplied during a second period from an end of the first period until the bonding surface of the substrate is completely modified.

4. The surface modifying method of claim 1, wherein, in the adjusting of the amount of moisture, the humidified gas is further supplied into the processing vessel during a third period from when the another substrate before being modified is carried into the processing vessel in place of the substrate after being modified until a bonding surface of the another substrate is completely modified.

5. The surface modifying method of claim 1, wherein the processing gas is at least any one of an oxygen gas, a nitrogen gas, or an argon gas.

6. A surface modifying apparatus configured to modify a bonding surface of a substrate to be bonded to another substrate by plasma of a processing gas, the surface modifying apparatus comprising:

a processing vessel configured to accommodate the substrate therein;

a first gas supply configured to supply the processing gas into the processing vessel;

a second gas supply configured to supply a humidified gas into the processing vessel;

a measurer configured to measure a value indicating an amount of moisture in the processing vessel; and a controller, wherein the controller controls individual components of the surface modifying apparatus to perform a surface modifying method, and the surface modifying method comprises:

adjusting the amount of moisture in the processing vessel by supplying the humidified gas into the processing vessel;

modifying the bonding surface of the substrate by forming the plasma of the processing gas in the processing vessel in a state that the amount of moisture in the processing vessel is adjusted; and measuring a value indicating the amount of moisture in the processing vessel while performing the adjusting of the amount of moisture, wherein the measuring of the value comprises acquiring light emission data of the processing gas supplied into the processing vessel and measuring, as the value indicating the amount of moisture in the processing vessel, a peak value generated at a specific wavelength in the light emission data, and wherein, in the adjusting of the amount of moisture, a flow rate or a moisture content of the humidified gas is controlled based on the peak value generated at the specific wavelength in the light emission data, which is measured in the measuring of the value.

* * * * *